United States Patent
Hush et al.

(10) Patent No.: US 10,522,210 B2
(45) Date of Patent: Dec. 31, 2019

(54) APPARATUSES AND METHODS FOR SUBARRAY ADDRESSING

(71) Applicant: Micron Technology, Inc., Boise, ID (US)

(72) Inventors: Glen E. Hush, Boise, ID (US); Richard C. Murphy, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/842,597

(22) Filed: Dec. 14, 2017

(65) Prior Publication Data

US 2019/0189188 A1    Jun. 20, 2019

(51) Int. Cl.
| | |
|---|---|
| G11C 5/02 | (2006.01) |
| G11C 11/408 | (2006.01) |
| G11C 11/4076 | (2006.01) |
| G11C 11/4091 | (2006.01) |
| G11C 11/4093 | (2006.01) |
| G11C 11/4096 | (2006.01) |

(52) U.S. Cl.
CPC ...... *G11C 11/4087* (2013.01); *G11C 11/4076* (2013.01); *G11C 11/4091* (2013.01); *G11C 11/4093* (2013.01); *G11C 11/4096* (2013.01)

(58) Field of Classification Search
CPC ............ G11C 11/4087; G11C 11/4091; G11C 11/4096; G11C 11/4076; G11C 11/4093
USPC .......................................................... 365/51
See application file for complete search history.

(56) References Cited

U.S. PATENT DOCUMENTS

| | | |
|---|---|---|
| 4,380,046 A | 4/1983 | Fung |
| 4,435,792 A | 3/1984 | Bechtolsheim |
| 4,435,793 A | 3/1984 | Ochii |
| | (Continued) | |

FOREIGN PATENT DOCUMENTS

| | | |
|---|---|---|
| CN | 102141905 | 8/2011 |
| EP | 0214718 | 3/1987 |
| | (Continued) | |

OTHER PUBLICATIONS

"4.9.3 MINLOC and MAXLOC", Jun. 12, 1995, (5pgs.), Message Passing Interface Forum 1.1, retrieved from http://www.mpi-forum.org/docs/mpi-1.1/mpi-11-html/node79.html.

(Continued)

*Primary Examiner* — Tha-O H Bui
(74) *Attorney, Agent, or Firm* — Brooks, Cameron & Huebsch, PLLC

(57) ABSTRACT

Systems, apparatuses and methods related to subarray addressing for electronic memory and/or storage are described. Concurrent access to different rows within different subarrays may be enabled via independent subarray addressing such that each of the subarrays may serve as a "virtual bank." Accessing the different rows as such may provide improved throughput of data values accessed from the respective rows being sent to a destination location. For instance, one such apparatus includes a plurality of subarrays within a bank of a memory device. Circuitry within the bank is coupled to the plurality of subarrays. The circuitry may be configured to activate a row at a particular ordinal position in a first subarray during a time period and a row at a different ordinal position in a second subarray of the plurality of subarrays during the same time period.

8 Claims, 7 Drawing Sheets

(56) References Cited

U.S. PATENT DOCUMENTS

| | | |
|---|---|---|
| 4,727,474 A | 2/1988 | Batcher |
| 4,843,264 A | 6/1989 | Galbraith |
| 4,958,378 A | 9/1990 | Bell |
| 4,977,542 A | 12/1990 | Matsuda et al. |
| 5,023,838 A | 6/1991 | Herbert |
| 5,034,636 A | 7/1991 | Reis et al. |
| 5,201,039 A | 4/1993 | Sakamura |
| 5,210,850 A | 5/1993 | Kelly et al. |
| 5,253,308 A | 10/1993 | Johnson |
| 5,276,643 A | 1/1994 | Hoffman et al. |
| 5,325,519 A | 6/1994 | Long et al. |
| 5,367,488 A | 11/1994 | An |
| 5,379,257 A | 1/1995 | Matsumura et al. |
| 5,386,379 A | 1/1995 | Ali-Yahia et al. |
| 5,398,213 A | 3/1995 | Yeon et al. |
| 5,440,482 A | 8/1995 | Davis |
| 5,446,690 A | 8/1995 | Tanaka et al. |
| 5,473,576 A | 12/1995 | Matsui |
| 5,481,500 A | 1/1996 | Reohr et al. |
| 5,485,373 A | 1/1996 | Davis et al. |
| 5,490,119 A * | 2/1996 | Sakurai .............. G11C 8/08 326/106 |
| 5,506,811 A | 4/1996 | McLaury |
| 5,615,404 A | 3/1997 | Knoll et al. |
| 5,638,128 A | 6/1997 | Hoogenboom |
| 5,638,317 A | 6/1997 | Tran |
| 5,654,936 A | 8/1997 | Cho |
| 5,678,021 A | 10/1997 | Pawate et al. |
| 5,724,291 A | 3/1998 | Matano |
| 5,724,366 A | 3/1998 | Furutani |
| 5,751,987 A | 5/1998 | Mahant-Shetti et al. |
| 5,787,458 A | 7/1998 | Miwa |
| 5,854,636 A | 12/1998 | Watanabe et al. |
| 5,867,429 A | 2/1999 | Chen et al. |
| 5,870,504 A | 2/1999 | Nemoto et al. |
| 5,915,084 A | 6/1999 | Wendell |
| 5,917,770 A * | 6/1999 | Tanaka .............. G11C 8/00 345/100 |
| 5,935,263 A | 8/1999 | Keeth et al. |
| 5,986,942 A | 11/1999 | Sugibayashi |
| 5,991,209 A | 11/1999 | Chow |
| 5,991,785 A | 11/1999 | Alidina et al. |
| 6,005,799 A | 12/1999 | Rao |
| 6,009,020 A | 12/1999 | Nagata |
| 6,092,186 A | 7/2000 | Betker et al. |
| 6,122,211 A | 9/2000 | Morgan et al. |
| 6,125,071 A | 9/2000 | Kohno et al. |
| 6,134,164 A | 10/2000 | Lattimore et al. |
| 6,147,514 A | 11/2000 | Shiratake |
| 6,151,244 A | 11/2000 | Fujino et al. |
| 6,157,578 A | 12/2000 | Brady |
| 6,163,862 A | 12/2000 | Adams et al. |
| 6,166,942 A | 12/2000 | Vo et al. |
| 6,172,918 B1 | 1/2001 | Hidaka |
| 6,175,514 B1 | 1/2001 | Henderson |
| 6,181,698 B1 | 1/2001 | Hariguchi |
| 6,208,544 B1 | 3/2001 | Beadle et al. |
| 6,226,215 B1 | 5/2001 | Yoon |
| 6,301,153 B1 | 10/2001 | Takeuchi et al. |
| 6,301,164 B1 | 10/2001 | Manning et al. |
| 6,304,477 B1 | 10/2001 | Naji |
| 6,389,507 B1 | 5/2002 | Sherman |
| 6,418,498 B1 | 7/2002 | Martwick |
| 6,466,499 B1 | 10/2002 | Blodgett |
| 6,510,098 B1 | 1/2003 | Taylor |
| 6,563,754 B1 | 5/2003 | Lien et al. |
| 6,578,058 B1 | 6/2003 | Nygaard |
| 6,731,542 B1 | 5/2004 | Le et al. |
| 6,754,746 B1 | 6/2004 | Leung et al. |
| 6,768,679 B1 | 7/2004 | Le et al. |
| 6,807,614 B2 | 10/2004 | Chung |
| 6,816,422 B2 | 11/2004 | Hamade et al. |
| 6,819,612 B1 | 11/2004 | Achter |
| 6,894,549 B2 | 5/2005 | Eliason |
| 6,943,579 B1 | 9/2005 | Hazanchuk et al. |
| 6,948,056 B1 | 9/2005 | Roth |
| 6,950,771 B1 | 9/2005 | Fan et al. |
| 6,950,898 B2 | 9/2005 | Merritt et al. |
| 6,956,770 B2 | 10/2005 | Khalid et al. |
| 6,961,272 B2 | 11/2005 | Schreck |
| 6,965,648 B1 | 11/2005 | Smith et al. |
| 6,985,394 B2 | 1/2006 | Kim |
| 6,987,693 B2 | 1/2006 | Cernea et al. |
| 7,020,017 B2 | 3/2006 | Chen et al. |
| 7,028,170 B2 | 4/2006 | Saulsbury |
| 7,045,834 B2 | 5/2006 | Tran et al. |
| 7,054,178 B1 | 5/2006 | Shiah et al. |
| 7,061,817 B2 | 6/2006 | Raad et al. |
| 7,079,407 B1 | 7/2006 | Dimitrelis |
| 7,173,857 B2 | 2/2007 | Kato et al. |
| 7,187,585 B2 | 3/2007 | Li et al. |
| 7,196,928 B2 | 3/2007 | Chen |
| 7,260,565 B2 | 8/2007 | Lee et al. |
| 7,260,672 B2 | 8/2007 | Gamey |
| 7,372,715 B2 | 5/2008 | Han |
| 7,400,532 B2 | 7/2008 | Aritome |
| 7,406,494 B2 | 7/2008 | Magee |
| 7,447,720 B2 | 11/2008 | Beaumont |
| 7,454,451 B2 | 11/2008 | Beaumont |
| 7,457,181 B2 | 11/2008 | Lee et al. |
| 7,535,769 B2 | 5/2009 | Cernea |
| 7,546,438 B2 | 6/2009 | Chung |
| 7,562,198 B2 | 7/2009 | Noda et al. |
| 7,574,466 B2 | 8/2009 | Beaumont |
| 7,602,647 B2 | 10/2009 | Li et al. |
| 7,663,928 B2 | 2/2010 | Tsai et al. |
| 7,685,365 B2 | 3/2010 | Rajwar et al. |
| 7,692,466 B2 | 4/2010 | Ahmadi |
| 7,752,417 B2 | 7/2010 | Manczak et al. |
| 7,791,962 B2 | 9/2010 | Noda et al. |
| 7,796,453 B2 | 9/2010 | Riho et al. |
| 7,805,587 B1 | 9/2010 | Van Dyke et al. |
| 7,808,854 B2 | 10/2010 | Takase |
| 7,827,372 B2 | 11/2010 | Bink et al. |
| 7,869,273 B2 | 1/2011 | Lee et al. |
| 7,898,864 B2 | 3/2011 | Dong |
| 7,924,628 B2 | 4/2011 | Danon et al. |
| 7,937,535 B2 | 5/2011 | Ozer et al. |
| 7,957,206 B2 | 6/2011 | Bauser |
| 7,979,667 B2 | 7/2011 | Allen et al. |
| 7,996,749 B2 | 8/2011 | Ding et al. |
| 8,042,082 B2 | 10/2011 | Solomon |
| 8,045,391 B2 | 10/2011 | Mohklesi |
| 8,059,438 B2 | 11/2011 | Chang et al. |
| 8,095,825 B2 | 1/2012 | Hirotsu et al. |
| 8,117,462 B2 | 2/2012 | Snapp et al. |
| 8,164,942 B2 | 4/2012 | Gebara et al. |
| 8,208,328 B2 | 6/2012 | Hong |
| 8,213,248 B2 | 7/2012 | Moon et al. |
| 8,223,568 B2 | 7/2012 | Seo |
| 8,238,173 B2 | 8/2012 | Akerib et al. |
| 8,274,841 B2 | 9/2012 | Shinano et al. |
| 8,279,683 B2 | 10/2012 | Klein |
| 8,310,884 B2 | 11/2012 | Iwai et al. |
| 8,332,367 B2 | 12/2012 | Bhattacherjee et al. |
| 8,339,824 B2 | 12/2012 | Cooke |
| 8,339,883 B2 | 12/2012 | Yu et al. |
| 8,347,154 B2 | 1/2013 | Bahali et al. |
| 8,351,292 B2 | 1/2013 | Matano |
| 8,356,144 B2 | 1/2013 | Hessel et al. |
| 8,417,921 B2 | 4/2013 | Gonion et al. |
| 8,462,532 B1 | 6/2013 | Argyres |
| 8,484,276 B2 | 7/2013 | Carlson et al. |
| 8,495,438 B2 | 7/2013 | Roine |
| 8,503,250 B2 | 8/2013 | Demone |
| 8,526,239 B2 | 9/2013 | Kim |
| 8,533,245 B1 | 9/2013 | Cheung |
| 8,555,037 B2 | 10/2013 | Gonion |
| 8,599,613 B2 | 12/2013 | Abiko et al. |
| 8,605,015 B2 | 12/2013 | Guttag et al. |
| 8,625,376 B2 | 1/2014 | Jung et al. |
| 8,644,101 B2 | 2/2014 | Jun et al. |
| 8,650,232 B2 | 2/2014 | Stortz et al. |
| 8,873,272 B2 | 10/2014 | Lee |

(56) References Cited

U.S. PATENT DOCUMENTS

| | | |
|---|---|---|
| 8,964,496 B2 | 2/2015 | Manning |
| 8,971,124 B1 | 3/2015 | Manning |
| 9,015,390 B2 | 4/2015 | Klein |
| 9,047,193 B2 | 6/2015 | Lin et al. |
| 9,165,023 B2 | 10/2015 | Moskovich et al. |
| 2001/0007112 A1 | 7/2001 | Porterfield |
| 2001/0008492 A1 | 7/2001 | Higashiho |
| 2001/0010057 A1 | 7/2001 | Yamada |
| 2001/0028584 A1 | 10/2001 | Nakayama et al. |
| 2001/0043089 A1 | 11/2001 | Forbes et al. |
| 2002/0059355 A1 | 5/2002 | Peleg et al. |
| 2003/0167426 A1 | 9/2003 | Slobodnik |
| 2003/0222879 A1 | 12/2003 | Lin et al. |
| 2004/0073592 A1 | 4/2004 | Kim et al. |
| 2004/0073773 A1 | 4/2004 | Demjanenko |
| 2004/0085840 A1 | 5/2004 | Vali et al. |
| 2004/0095826 A1 | 5/2004 | Perner |
| 2004/0154002 A1 | 8/2004 | Ball et al. |
| 2004/0205289 A1 | 10/2004 | Srinivasan |
| 2004/0240251 A1 | 12/2004 | Nozawa et al. |
| 2005/0015557 A1 | 1/2005 | Wang et al. |
| 2005/0078514 A1 | 4/2005 | Scheuerlein et al. |
| 2005/0097417 A1 | 5/2005 | Agrawal et al. |
| 2006/0047937 A1 | 3/2006 | Selvaggi et al. |
| 2006/0069849 A1 | 3/2006 | Rudelic |
| 2006/0146623 A1 | 7/2006 | Mizuno et al. |
| 2006/0149804 A1 | 7/2006 | Luick et al. |
| 2006/0181917 A1 | 8/2006 | Kang et al. |
| 2006/0215432 A1 | 9/2006 | Wickeraad et al. |
| 2006/0225072 A1 | 10/2006 | Lari et al. |
| 2006/0291282 A1 | 12/2006 | Liu et al. |
| 2007/0103986 A1 | 5/2007 | Chen |
| 2007/0171747 A1 | 7/2007 | Hunter et al. |
| 2007/0180006 A1 | 8/2007 | Gyoten et al. |
| 2007/0180184 A1 | 8/2007 | Sakashita et al. |
| 2007/0195602 A1 | 8/2007 | Fong et al. |
| 2007/0247953 A1 | 10/2007 | Huang |
| 2007/0285131 A1 | 12/2007 | Sohn |
| 2007/0285979 A1 | 12/2007 | Turner |
| 2007/0291532 A1 | 12/2007 | Tsuji |
| 2008/0025073 A1 | 1/2008 | Arsovski |
| 2008/0037333 A1 | 2/2008 | Kim et al. |
| 2008/0052711 A1 | 2/2008 | Forin et al. |
| 2008/0137388 A1 | 6/2008 | Krishnan et al. |
| 2008/0165601 A1 | 7/2008 | Matick et al. |
| 2008/0178053 A1 | 7/2008 | Gorman et al. |
| 2008/0215937 A1 | 9/2008 | Dreibelbis et al. |
| 2009/0067218 A1 | 3/2009 | Graber |
| 2009/0154238 A1 | 6/2009 | Lee |
| 2009/0154273 A1 | 6/2009 | Borot et al. |
| 2009/0254697 A1 | 10/2009 | Akerib |
| 2010/0067296 A1 | 3/2010 | Li |
| 2010/0091582 A1 | 4/2010 | Vali et al. |
| 2010/0149900 A1 | 6/2010 | Kitayama |
| 2010/0172190 A1 | 7/2010 | Lavi et al. |
| 2010/0210076 A1 | 8/2010 | Gruber et al. |
| 2010/0226183 A1 | 9/2010 | Kim |
| 2010/0308858 A1 | 12/2010 | Noda et al. |
| 2010/0332895 A1 | 12/2010 | Billing et al. |
| 2011/0051523 A1 | 3/2011 | Manabe et al. |
| 2011/0063919 A1 | 3/2011 | Chandrasekhar et al. |
| 2011/0093662 A1 | 4/2011 | Walker et al. |
| 2011/0103151 A1 | 5/2011 | Kim et al. |
| 2011/0119467 A1 | 5/2011 | Cadambi et al. |
| 2011/0122695 A1 | 5/2011 | Li et al. |
| 2011/0140741 A1 | 6/2011 | Zerbe et al. |
| 2011/0219260 A1 | 9/2011 | Nobunaga et al. |
| 2011/0267883 A1 | 11/2011 | Lee et al. |
| 2011/0317496 A1 | 12/2011 | Bunce et al. |
| 2012/0005397 A1 | 1/2012 | Lim et al. |
| 2012/0017039 A1 | 1/2012 | Margetts |
| 2012/0023281 A1 | 1/2012 | Kawasaki et al. |
| 2012/0120705 A1 | 5/2012 | Mitsubori et al. |
| 2012/0134216 A1 | 5/2012 | Singh |
| 2012/0134225 A1 | 5/2012 | Chow |
| 2012/0134226 A1 | 5/2012 | Chow |
| 2012/0140540 A1 | 6/2012 | Agam et al. |
| 2012/0182798 A1 | 7/2012 | Hosono et al. |
| 2012/0195146 A1 | 8/2012 | Jun et al. |
| 2012/0198310 A1 | 8/2012 | Tran et al. |
| 2012/0246380 A1 | 9/2012 | Akerib et al. |
| 2012/0265964 A1 | 10/2012 | Murata et al. |
| 2012/0281486 A1 | 11/2012 | Rao et al. |
| 2012/0303627 A1 | 11/2012 | Keeton et al. |
| 2013/0003467 A1 | 1/2013 | Klein |
| 2013/0061006 A1 | 3/2013 | Hein |
| 2013/0107623 A1 | 5/2013 | Kavalipurapu et al. |
| 2013/0117541 A1 | 5/2013 | Choquette et al. |
| 2013/0124783 A1 | 5/2013 | Yoon et al. |
| 2013/0132702 A1 | 5/2013 | Patel et al. |
| 2013/0138646 A1 | 5/2013 | Sirer et al. |
| 2013/0163362 A1 | 6/2013 | Kim |
| 2013/0173888 A1 | 7/2013 | Hansen et al. |
| 2013/0205114 A1 | 8/2013 | Badam et al. |
| 2013/0219112 A1 | 8/2013 | Okin et al. |
| 2013/0227361 A1 | 8/2013 | Bowers et al. |
| 2013/0283122 A1 | 10/2013 | Anholt et al. |
| 2013/0286705 A1 | 10/2013 | Grover et al. |
| 2013/0326154 A1 | 12/2013 | Haswell |
| 2013/0332707 A1 | 12/2013 | Gueron et al. |
| 2014/0185395 A1 | 7/2014 | Seo |
| 2014/0215185 A1 | 7/2014 | Danielsen |
| 2014/0250279 A1 | 9/2014 | Manning |
| 2014/0344934 A1 | 11/2014 | Jorgensen |
| 2015/0029798 A1 | 1/2015 | Manning |
| 2015/0042380 A1 | 2/2015 | Manning |
| 2015/0063052 A1 | 3/2015 | Manning |
| 2015/0078108 A1 | 3/2015 | Cowles et al. |
| 2015/0120987 A1 | 4/2015 | Wheeler |
| 2015/0134713 A1 | 5/2015 | Wheeler |
| 2015/0270015 A1 | 9/2015 | Murphy et al. |
| 2015/0279466 A1 | 10/2015 | Manning |
| 2015/0309743 A1 | 10/2015 | Sohn et al. |
| 2015/0324290 A1 | 11/2015 | Leidel |
| 2015/0325272 A1 | 11/2015 | Murphy |
| 2015/0356009 A1 | 12/2015 | Wheeler et al. |
| 2015/0356022 A1 | 12/2015 | Leidel et al. |
| 2015/0357007 A1 | 12/2015 | Manning et al. |
| 2015/0357008 A1 | 12/2015 | Manning et al. |
| 2015/0357019 A1 | 12/2015 | Wheeler et al. |
| 2015/0357020 A1 | 12/2015 | Manning |
| 2015/0357021 A1 | 12/2015 | Hush |
| 2015/0357022 A1 | 12/2015 | Hush |
| 2015/0357023 A1 | 12/2015 | Hush |
| 2015/0357024 A1 | 12/2015 | Hush et al. |
| 2015/0357047 A1 | 12/2015 | Tiwari |
| 2016/0062672 A1 | 3/2016 | Wheeler |
| 2016/0062673 A1 | 3/2016 | Tiwari |
| 2016/0062692 A1 | 3/2016 | Finkbeiner et al. |
| 2016/0062733 A1 | 3/2016 | Tiwari |
| 2016/0063284 A1 | 3/2016 | Tiwari |
| 2016/0064045 A1 | 3/2016 | La Fratta |
| 2016/0064047 A1 | 3/2016 | Tiwari |
| 2016/0098208 A1 | 4/2016 | Willcock |
| 2016/0098209 A1 | 4/2016 | Leidel et al. |
| 2016/0110135 A1 | 4/2016 | Wheeler et al. |
| 2016/0125919 A1 | 5/2016 | Hush |
| 2016/0154596 A1 | 6/2016 | Willcock et al. |
| 2016/0155482 A1 | 6/2016 | La Fratta |
| 2016/0188250 A1 | 6/2016 | Wheeler |
| 2016/0196142 A1 | 7/2016 | Wheeler et al. |
| 2016/0196856 A1 | 7/2016 | Tiwari et al. |
| 2016/0216912 A1 | 7/2016 | Muralimanohar et al. |
| 2016/0225422 A1 | 8/2016 | Tiwari et al. |
| 2016/0266873 A1 | 9/2016 | Tiwari et al. |
| 2016/0266899 A1 | 9/2016 | Tiwari |
| 2016/0267951 A1 | 9/2016 | Tiwari |
| 2016/0292080 A1 | 10/2016 | Leidel et al. |
| 2016/0306584 A1 | 10/2016 | Zawodny et al. |
| 2016/0306614 A1 | 10/2016 | Leidel et al. |
| 2016/0365129 A1 | 12/2016 | Willcock |
| 2016/0371033 A1 | 12/2016 | La Fratta et al. |
| 2017/0052906 A1 | 2/2017 | Lea |
| 2017/0083401 A1 | 3/2017 | Ryu et al. |

(56) References Cited

U.S. PATENT DOCUMENTS

| | | |
|---|---|---|
| 2017/0178701 A1 | 6/2017 | Willcock et al. |
| 2017/0192844 A1 | 7/2017 | Lea et al. |
| 2017/0213586 A1 | 7/2017 | Kang et al. |
| 2017/0228192 A1 | 8/2017 | Willcock et al. |
| 2017/0235515 A1 | 8/2017 | Lea et al. |
| 2017/0236564 A1 | 8/2017 | Zawodny et al. |
| 2017/0242902 A1 | 8/2017 | Crawford et al. |
| 2017/0243623 A1 | 8/2017 | Kirsch et al. |
| 2017/0262369 A1 | 9/2017 | Murphy |
| 2017/0263295 A1 | 9/2017 | Xiao et al. |
| 2017/0263306 A1 | 9/2017 | Murphy |
| 2017/0269865 A1 | 9/2017 | Willcock et al. |
| 2017/0269903 A1 | 9/2017 | Tiwari |
| 2017/0277433 A1 | 9/2017 | Willcock |
| 2017/0277440 A1 | 9/2017 | Willcock |
| 2017/0277581 A1 | 9/2017 | Lea et al. |
| 2017/0277637 A1 | 9/2017 | Willcock et al. |
| 2017/0278559 A1 | 9/2017 | Hush |
| 2017/0278584 A1 | 9/2017 | Rosti |
| 2017/0285988 A1 | 10/2017 | Dobelstein |
| 2017/0293434 A1 | 10/2017 | Tiwari |
| 2017/0301379 A1 | 10/2017 | Hush |
| 2017/0309314 A1 | 10/2017 | Zawodny et al. |
| 2017/0336989 A1 | 11/2017 | Zawodny et al. |
| 2017/0337126 A1 | 11/2017 | Zawodny et al. |
| 2017/0337953 A1 | 11/2017 | Zawodny et al. |
| 2017/0352391 A1 | 12/2017 | Hush |

FOREIGN PATENT DOCUMENTS

| | | |
|---|---|---|
| EP | 2026209 | 2/2009 |
| JP | H0831168 | 2/1996 |
| JP | 2009259193 | 3/2015 |
| KR | 10-0211482 | 8/1998 |
| KR | 10-2010-0134235 | 12/2010 |
| KR | 10-2013-0049421 | 5/2013 |
| WO | 2001065359 | 9/2001 |
| WO | 2010079451 | 7/2010 |
| WO | 2013062596 | 5/2013 |
| WO | 2013081588 | 6/2013 |
| WO | 2013095592 | 6/2013 |

OTHER PUBLICATIONS

Stojmenovic, "Multiplicative Circulant Networks Topological Properties and Communication Algorithms", (25 pgs.), Discrete Applied Mathematics 77 (1997) 281-305.

Boyd et al., "On the General Applicability of Instruction-Set Randomization", Jul.-Sep. 2010, (14 pgs.), vol. 7, Issue 3, IEEE Transactions on Dependable and Secure Computing.

Elliot, et al., "Computational RAM: Implementing Processors in Memory", Jan.-Mar. 1999, (10 pgs.), vol. 16, Issue 1, IEEE Design and Test of Computers Magazine.

Dybdahl, et al., "Destructive-Read in Embedded DRAM, Impact on Power Consumption," Apr. 2006, (10 pgs.), vol. 2, Issue 2, Journal of Embedded Computing-Issues in embedded single-chip multicore architectures.

Kogge, et al., "Processing in Memory: Chips to Petaflops," May 23, 1997, (8 pgs.), retrieved from: http://www.cs.ucf.edu/courses/cda5106/summer02/papers/kogge97PIM.pdf.

Draper, et al., "The Architecture of the DIVA Processing-In-Memory Chip," Jun. 22-26, 2002, (12 pgs.), ICS '02, retrieved from: http://www.isi.edu/~draper/papers/ics02.pdf.

Adibi, et al., "Processing-In-Memory Technology for Knowledge Discovery Algorithms," Jun. 25, 2006, (10 pgs.), Proceeding of the Second International Workshop on Data Management on New Hardware, retrieved from: http://www.cs.cmu.edu/~damon2006/pdf/adibi06inmemory.pdf.

U.S. Appl. No. 13/449,082, entitled, "Methods and Apparatus for Pattern Matching," filed Apr. 17, 2012, (37 pgs.).

U.S. Appl. No. 13/743,686, entitled, "Weighted Search and Compare in a Memory Device," filed Jan. 17, 2013, (25 pgs.).

U.S. Appl. No. 13/774,636, entitled, "Memory as a Programmable Logic Device," filed Feb. 22, 2013, (30 pgs.).

U.S. Appl. No. 13/774,553, entitled, "Neural Network in a Memory Device," filed Feb. 22, 2013, (63 pgs.).

U.S. Appl. No. 13/796,189, entitled, "Performing Complex Arithmetic Functions in a Memory Device," filed Mar. 12, 2013, (23 pgs.).

International Search Report and Written Opinion for PCT Application No. PCT/US2013/043702, dated Sep. 26, 2013, (11 pgs.).

Pagiamtzis, et al., "Content-Addressable Memory (CAM) Circuits and Architectures: A Tutorial and Survey", Mar. 2006, (16 pgs.), vol. 41, No. 3, IEEE Journal of Solid-State Circuits.

Pagiamtzis, Kostas, "Content-Addressable Memory Introduction", Jun. 25, 2007, (6 pgs.), retrieved from: http://www.pagiamtzis.com/cam/camintro.

Debnath, Biplob, Bloomflash: Bloom Filter on Flash-Based Storage, 2011 31st Annual Conference on Distributed Computing Systems, Jun. 20-24, 2011, 10 pgs.

Derby, et al., "A High-Performance Embedded DSP Core with Novel SIMD Features", Apr. 6-10, 2003, (4 pgs), vol. 2, pp. 301-304, 2003 IEEE International Conference on Accoustics, Speech, and Signal Processing.

International Search Report and Written Opinion for related PCT Application No. PCT/US2018/064657, dated Mar. 29, 2019, 12 pages.

\* cited by examiner

APPARATUSES AND METHODS FOR SUBARRAY ADDRESSING

TECHNICAL FIELD

The present disclosure relates generally to semiconductor memory and methods, and more particularly, to apparatuses and methods for subarray addressing.

BACKGROUND

Memory devices are typically provided as internal, semiconductor, integrated circuits in computers or other electronic systems. There are many different types of memory including volatile and non-volatile memory. Volatile memory can require power to maintain its data (e.g., host data, error data, etc.) and includes random access memory (RAM), dynamic random access memory (DRAM), static random access memory (SRAM), synchronous dynamic random access memory (SDRAM), and thyristor random access memory (TRAM), among others. Non-volatile memory can provide persistent data by retaining stored data when not powered and can include NAND flash memory, NOR flash memory, and resistance variable memory such as phase change random access memory (PCRAM), resistive random access memory (RRAM), and magnetoresistive random access memory (MRAM), such as spin torque transfer random access memory (STT RAM), among others.

Electronic systems often include a number of processing resources (e.g., one or more processors), which may retrieve and execute instructions and store the results of the executed instructions to a suitable location. A processor can include a number of functional units such as arithmetic logic unit (ALU) circuitry, floating point unit (FPU) circuitry, and a combinatorial logic block, for example, which can be used to execute instructions by performing logical operations such as AND, OR, NOT, NAND, NOR, and XOR, and invert (e.g., inversion) logical operations on data (e.g., one or more operands). For example, functional unit circuitry may be used to perform arithmetic operations such as addition, subtraction, multiplication, and division on operands via a number of operations.

In many instances, the processing resources may be external to the memory array, and data is accessed via a bus between the processing resources and the memory array to execute a set of instructions. However, accessing data and/or movement of such data within a bank of a memory device or from the bank to a processor external to the memory device may influence the time used for data processing.

DETAILED DESCRIPTION

Figure 1A:
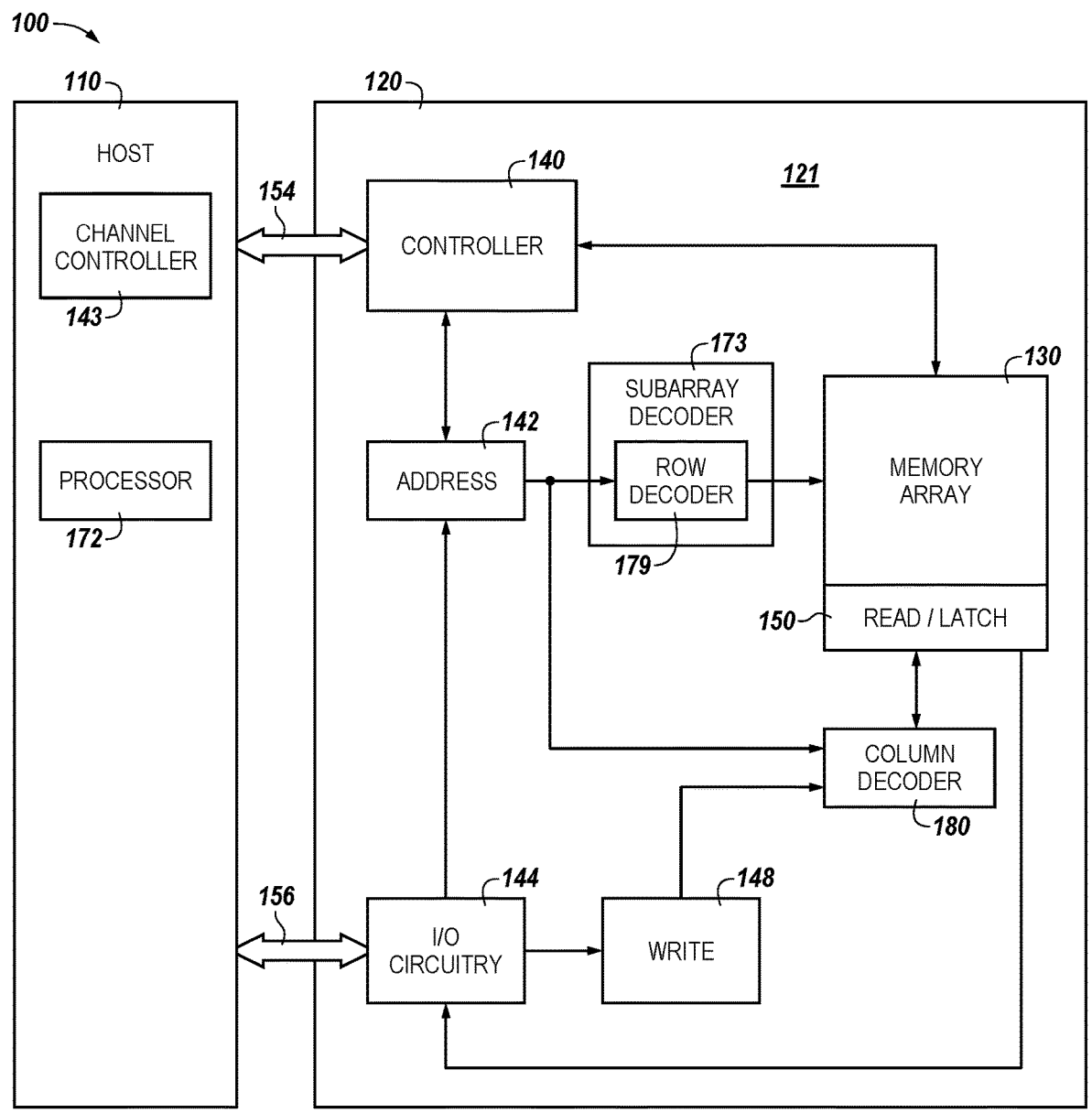
FIG. 1A is a block diagram of an apparatus in the form of a computing system including a memory device in accordance with a number of embodiments of the present disclosure.

The present disclosure includes systems, apparatuses and methods associated with subarray addressing. In a number of embodiments, an apparatus includes a plurality of subarrays within a bank of a memory device. The apparatus further includes circuitry within the bank that is coupled to the plurality of subarrays and configured to activate a row at a particular ordinal position in a first subarray of the plurality of subarrays during a time period and a row at a different ordinal position in a second subarray of the plurality of subarrays during the time period.

Implementations of address circuitry (e.g., for a DRAM configuration utilizing protocols such as DDR3, DDR4, etc.) may be configured to activate only one particular row at a time (e.g., per write/read cycle) within a bank of subarrays of memory cells. This may result in various drawbacks, such as an inability to concurrently activate/access different rows (e.g., rows at different ordinal positions) in different subarrays.

For example, the implementations of addressing utilizing such address circuitry and/or protocols may be performed by addressing a row at a particular ordinal position in a first subarray of the bank by using a first address signal that concurrently addresses a row at a same ordinal position in a second subarray of the bank. A second address signal may be used for switching from activation of the row at the particular ordinal position in the first subarray and the second subarray to activation of a row at a different ordinal position in the first subarray and the second subarray. Inactivation of the row at the particular ordinal position in the first subarray and the second subarray of the bank followed by activation of the row at the different ordinal position in the first subarray and the second subarray enabled by the second address signal may be unnecessarily slow and/or inefficient when only data values, for example, from the row at the particular ordinal position in the first subarray and the row at the different ordinal position in the second subarray are intended to be accessed (e.g., for data processing).

In contrast, a number of embodiments of the present disclosure describe activating a row at a particular ordinal position in a first subarray during a time period and a row at a different ordinal position in a second subarray (e.g., within a same bank) during the same time period. For example, the row at the particular ordinal position in the first subarray may, as described herein, be activated during the time period without activation of the row at the particular ordinal position in the second subarray, and the row at the different ordinal position in the second subarray may be activated during the same time period without activation of the row at the different ordinal position in the first subarray. Activation of the row at the particular ordinal position in the first subarray and the row at the different ordinal position in the second subarray during the same time period may enable a reduced latency between the sensing circuitry (e.g., read/latch circuitry) sensing the first data value stored in the row at the particular ordinal position in the first subarray and the read/latch circuitry sensing a second data value stored in the row at the different ordinal position in the second subarray relative to the implementation consistent with that presented above. Coupling an I/O line to the read/latch circuitry of the first subarray, to move a data value stored by the activated row at the particular ordinal position, and coupling the I/O line to the read/latch circuitry of the second subarray, to move a data value stored by the activated row at the different ordinal position, may be performed within a same time period.

A number of embodiments of the present disclosure may provide various benefits by, for example, independent subarray addressing enabling access to different rows in different subarrays of a bank within a particular time period (e.g., concurrently). Independently accessing the different subarrays and rows as such may allow each of the subarrays to function as a "virtual bank" relative to other protocol implementations (e.g., various DDR protocols which do not provide an ability to access different rows in different subarrays concurrently).

Such benefits may include improved throughput (e.g., increased speed, rate, and/or efficiency) associated with accessing (e.g., reading, writing, etc.) different rows within different subarrays of a bank of a memory device. For example, embodiments of the present disclosure may provide reduced latency associated with moving data from subarrays to the data inputs/outputs (I/Os), which may increase system processing speed (e.g., by providing increased throughput to a processing resource).

The figures herein follow a numbering convention in which the first digit or digits of a reference number correspond to the figure number and the remaining digits identify an element or component in the figure. Similar elements or components between different figures may be identified by the use of similar digits. For example, 130 may reference element "30" in FIG. 1A, and a similar element may be referenced as 230 in FIG. 2.

FIG. 1A is a block diagram of an apparatus in the form of a computing system 100 including a memory device 120 in accordance with a number of embodiments of the present disclosure. The system 100 may be a laptop computer, tablet computer, personal computer, digital camera, digital recording and playback device, mobile telephone, personal digital assistant (PDA), memory card reader, interface hub, sensor, Internet-of-Things (IoT) enabled device, among other systems. As used herein, a memory device 120, controller 140, subarray decoder 173, row decoder 179, memory array 130, read/latch circuitry 150, including sense amplifiers (e.g., sense amplifier 206 as shown in and described in connection with FIG. 2 and at corresponding reference numbers in FIGS. 4A and 4B), among other circuitry for subarray addressing shown and described herein, might each also be separately considered an "apparatus." The memory device 120, controller 140, memory array 130, etc., may form a bank 121 of the system 100 that includes a plurality of subarrays of memory cells (e.g., as shown at 125-0, 125-1, . . . , 125-N–1 and described in connection with FIG. 1B).

As described in more detail below, the embodiments may allow a computing system 100 to allocate a number of locations (e.g., subarrays) in a bank to hold (e.g., store) data. An embodiment of a bank that includes a plurality of subarrays is shown at 121 and 321 and described in connection with FIGS. 1B and 4, respectively, although other configurations are within the scope of the present disclosure. A host (e.g., as shown at 110) and/or a controller (e.g., as shown at 140) may perform address resolution on an entire block of instructions (e.g., commands associated with executing a program) and data and direct (e.g., control) allocation and storage of data and commands into allocated locations (e.g., subarrays and portions of subarrays) within a bank and/or to an external destination.

In a number of embodiments, reading and/or writing data and associated commands may utilize a data path and timing in a DRAM device based upon pre-existing protocols (e.g., DDR3, DDR4, etc.). In contrast, the circuitry and/or the address signals for subarray addressing and timing and/or associated with data movement (e.g., to a destination location for processing) described herein have not been previously implemented. As used herein, data movement is an inclusive term that includes, for instance, copying, transferring, and/or transporting data values from a source location to a destination location. As the reader will appreciate, while a DRAM-style memory device is discussed with regard to examples presented herein, embodiments are not limited to a DRAM implementation.

Speeds, rates, and/or efficiencies of subarray addressing, data access (e.g., to and from read/latch circuitry), and/or data movement within a bank (e.g., from subarrays and portions of subarrays and/or a controller therein) may affect whether data processing operations are completed (performed) efficiently. Accordingly, the present disclosure presents structures and processes that may increase a speed, rate, and/or efficiency of subarray addressing, data access, and/or associated data movement in a bank and/or to a processor by using improved subarray addressing circuitry and address signals, which may contribute to an improved usage of data path throughput capacity as compared to previous approaches.

In a number of embodiments, a row (e.g., as shown at 119 in FIG. 1B and at corresponding reference numbers elsewhere herein) of virtual address space in a memory device (e.g., as shown at 120 in FIG. 1A) may have a bit length of 16K bits (e.g., corresponding to 16,384 memory cells or complementary pairs of memory cells in a DRAM configuration). Read/latch circuitry (e.g., as shown at 150 in FIG. 1A and at corresponding reference numbers elsewhere herein) for such a 16K bit row may include a corresponding 16K sense amplifiers and associated circuitry (e.g., as shown at 206 in FIG. 2 and at corresponding reference numbers elsewhere herein) formed on pitch with the sense lines selectably coupled to corresponding memory cells in the 16K bit row. A sense amplifier in the memory device may operate as a cache for a single data value (bit) from the row of memory cells sensed by the read/latch circuitry 150 (e.g., sensed by and/or stored in the sense amplifier).

A number of embodiments of the present disclosure includes read/latch circuitry (e.g., sense amplifiers 206 and associated circuitry), which may be formed on pitch with sense lines of an array of memory cells. The read/latch circuitry and other data storage components described herein are capable of performing data sensing and/or storage (e.g., caching, latching, buffering etc.) of data local to the array of memory cells.

In order to appreciate the improved subarray addressing and associated data movement techniques described herein, a discussion of an apparatus for implementing such techniques (e.g., a memory device 120 having these capabilities and an associated host 110) follows. According to various embodiments, program instructions (e.g., commands) involving a memory device having the subarray addressing and associated data movement capabilities described herein may distribute implementation of the commands (e.g., address signals) and data over multiple read/latch and subarray addressing circuitries that may implement operations and may move and store the commands and data within the memory array (e.g., without having to transfer such back and forth over a bus between a host and the memory device). Thus, data for a memory device having the subarray addressing and associated data movement capabilities may be accessed and used in less time, along with using less power. For example, a time and power advantage may be realized by increasing the speed, rate, and/or efficiency of data being moved around and stored in a computing system in order to process requested memory array operations (e.g., reads, writes, logical operations, etc.) at a destination location.

The system 100 may include host 110 coupled (e.g., connected) to memory device 120, which includes the memory array 130 and the controller 140, among the various circuitry for subarray addressing, as shown and described herein. Host 110 may be responsible for execution of an operating system (OS) and/or various applications that may be loaded thereto (e.g., from memory device 120 via controller 140). Host 110 may include a system motherboard and backplane and may include a number of processing resources (e.g., one or more processors 172, microprocessors, or some other type of controlling circuitry) capable of accessing the memory device 120 (e.g., via controller 140) to perform operations on data values moved from the memory device 120 (e.g., using subarray addressing signals provided via controller 140). Controller 140 also may, in a number of embodiments, include a number of processing resources for performance of processing operations. The system 100 may include separate integrated circuits or both the host 110 and the memory device 120 may be on the same integrated circuit. The system 100 may, for instance, be a server system and a high performance computing (HPC) system or a portion thereof. Although the example shown in FIG. 1A illustrates a system having a Von Neumann architecture, embodiments of the present disclosure may be implemented in non-Von Neumann architectures, which may not include one or more components (e.g., CPU, ALU, etc.) often associated with a Von Neumann architecture.

The controller 140 (e.g., bank control logic and sequencer) may include control circuitry, in the form of hardware, firmware, or software, or combinations thereof. As an example, the controller 140 may include a state machine, a sequencer, and/or some other types of control circuitry, which may be implemented in the form of an application specific integrated circuit (ASIC) coupled to a printed circuit board. In a number of embodiments, the controller 140 may be co-located with the host 110 (e.g., in a system-on-chip (SOC) configuration).

For clarity, description of the system 100 has been simplified to focus on features with particular relevance to the present disclosure. For example, the array 130 may be a DRAM array, SRAM array, STT RAM array, PCRAM array, TRAM array, RRAM array, FeRAM array, phase-change memory array, 3DXpoint array, NAND flash array, and/or NOR flash array, for instance. The memory array 130 may include memory cells arranged in rows (e.g., in a plurality of subarrays) coupled by access lines (which may be referred to herein as word lines or select lines) and columns coupled by sense lines (which may be referred to herein as data lines or digit lines). Although a single bank 121 and a single memory array 130 are shown in FIG. 1A, embodiments are not so limited. For instance, memory device 120 may represent a plurality of banks 121 that each may include a plurality of memory arrays 130 (e.g., memory arrays included in a number of banks of DRAM cells, NAND flash cells, etc.) in addition to a plurality subarrays, as described herein. Accordingly, descriptions in the present disclosure may be made with regard to DRAM architectures by way of example and/or clarity. However, unless explicitly stated otherwise, the scope of the present disclosure and claims is not limited to DRAM architectures.

Figure 1B:
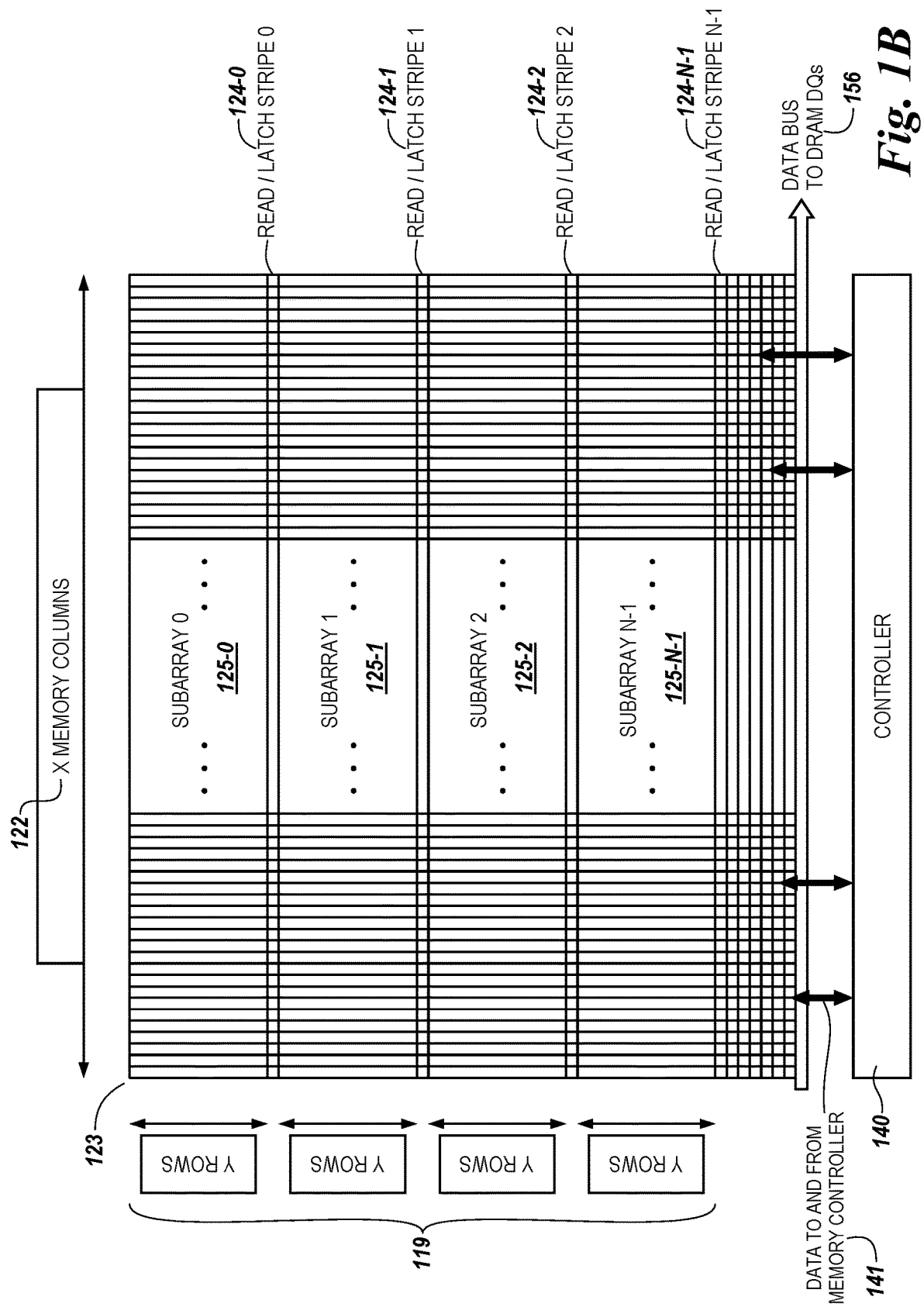
FIG. 1B is a block diagram of a bank section of a portion of a memory device in accordance with a number of embodiments of the present disclosure.

The memory device 120 may include address circuitry 142 to latch address signals provided over a data bus 156 (e.g., an I/O bus from host 110) by I/O circuitry 144 (e.g., provided to external ALU circuitry and to DRAM DQs via local I/O lines and global I/O lines). Status and exception information may be provided from the controller 140 of the memory device 120 to a channel controller 143, for example, through a control bus 154, which in turn may be provided from the channel controller 143 to host 110. Address signals may be received (e.g., from channel controller 143 or another host component) through address circuitry 142 and may be decoded via a subarray decoder 173, a row decoder 179, and/or a column decoder 180 to access the memory array 130. Data may be sensed (read) from memory array 130 by sensing voltage and/or current changes on sense lines (digit lines) using sensing circuitry (e.g., shown as read/latch circuitry 150 in FIG. 1A). The read/latch circuitry 150 may include a number of sense amplifiers, as described herein, to read and latch a page (e.g., a row or a portion of a row) of data from the memory array 130. Additional circuitry (e.g., subarray addressing circuitry, as described herein) may be part of, or coupled to, the address circuitry 142, the subarray decoder 173, the row decoder 179, the column decoder 180, and/or the read/latch circuitry 150. The I/O circuitry 144 may include data I/O pins to be used for bi-directional data communication with host 110 over the data bus 156 (e.g., a 64 bit wide data bus). The data bus 156 may be coupled to DRAM DQs, as shown in FIG. 1B. Write circuitry 148 may be used to write data to the memory array 130.

Controller 140 may decode signals (e.g., commands) provided by control bus 154 from host 110. The controller 140 may control operations by issuing signals determined from the decoded commands from host 110. These signals may include chip enable signals, write enable signals, address signals (e.g., subarray address signals, row address signals, and/or latch address signals) that may be used to control operations performed on the memory array 130, including data sense, data store, subarray addressing, row addressing, latch addressing, data move, data write, and data erase operations, among other operations. In various embodiments, the controller 140 may be responsible for executing instructions from host 110 and accessing the memory array 130.

FIG. 1B is a block diagram of a bank section 123 of a portion of a memory device 120 in accordance with a number of embodiments of the present disclosure. For example, bank section 123 may represent one of a plurality of bank sections corresponding to a bank 121 of a memory device. A bank architecture may include a plurality of columns (e.g., "X" columns 122 as shown in FIG. 1B). Additionally, the bank section 123 may be divided into a plurality of subarrays 125-0 (SUBARRAY 0), 125-1 (SUBARRAY 1), . . . , 125-N−1 (SUBARRAY 125-N−1), which may be separated by respective amplification regions that may include groups (e.g., sets) of sense amplifiers. The groups of sense amplifiers may be referred to as sense amplifier stripes or read/latch stripes. For example, as shown in FIG. 1B, each of the subarrays 125-0, 125-1, . . . , 125-N−1 has an associated read/latch stripe associated therewith (e.g., 124-0, 124-1, . . . , 124-N−1, respectively).

The bank 121 or bank section 123 may include 64 subarrays, 128 subarrays, 256 subarrays, 512 subarrays, among various other possible numbers of subarrays. However, embodiments are not so limited, such that some embodiments of a bank may have a different number of subarrays than just presented. In a number of embodiments, the subarrays may have the same number of rows in each subarray (e.g., 256 rows, 512 rows, 1024 rows, 2048 rows, among various other possible numbers of rows). However, embodiments are not so limited, such that at least some of a plurality of subarrays within the bank or bank section may have different numbers of rows.

Each column 122 is configured to be coupled to read/latch circuitry 150 (e.g., as described in connection with FIG. 1A and elsewhere herein). As such, each column in a subarray may be coupled individually to a sense amplifier that contributes to a set of sense amplifiers (e.g., a read/latch stripe) for that subarray. For example, as shown in FIG. 1B, the bank architecture may include read/latch stripe 0, read/latch stripe 1, . . . , read/latch stripe N–1, shown at 124-0, 124-1, . . . , 124-N–1, that each have read/latch circuitry 150 with a set of sense amplifiers that may, in various embodiments, be used as registers, cache, and data buffering. The sense amplifiers (e.g., as shown at 206 and described in connection with FIG. 2) may be coupled to each column 122 in the subarrays 125-0, 125-1, . . . , 125-N–1. Each of the of the subarrays 125-0, 125-1, . . . , 125-N–1 may include a respective plurality of rows (e.g., a respective group of "Y" rows 119)

Figure 2:
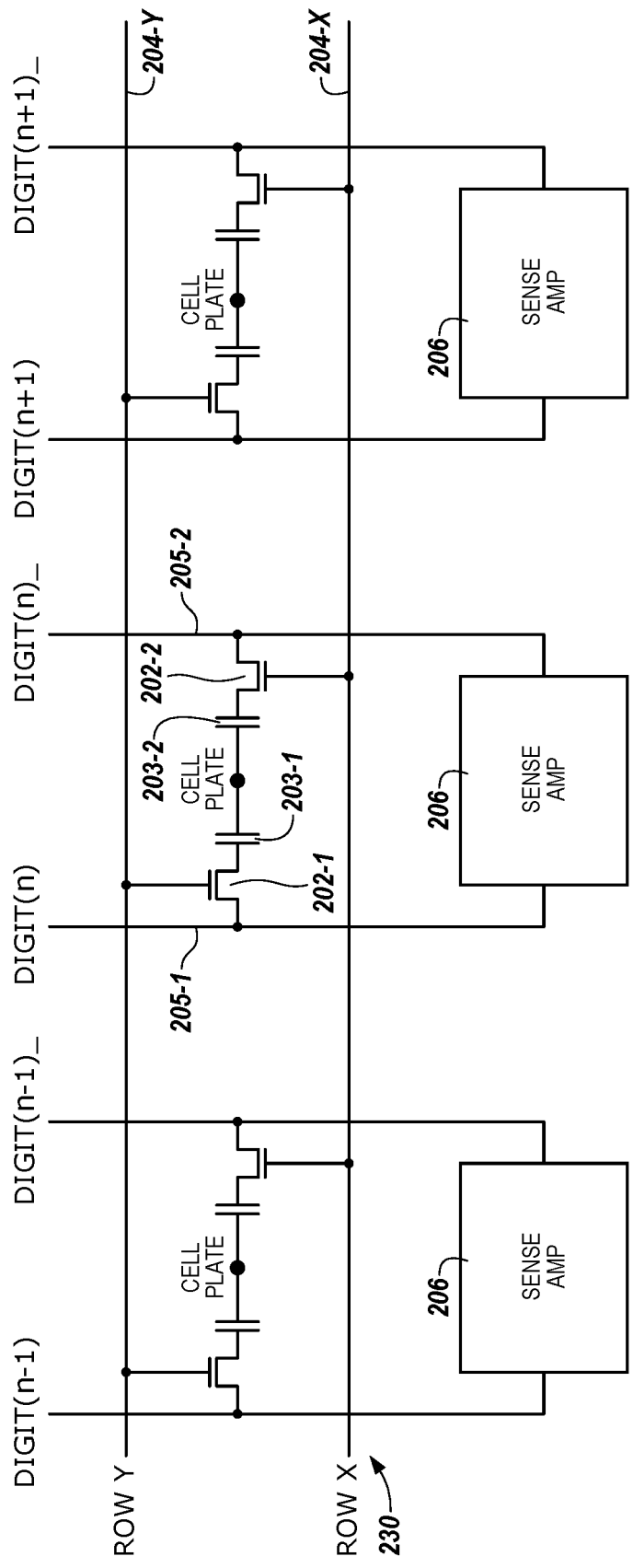
FIG. 2 is a schematic diagram of a portion of a memory device in accordance with a number of embodiments of the present disclosure.

FIG. 2 is a schematic diagram of a portion of a memory device in accordance with a number of embodiments of the present disclosure. FIG. 2 illustrates an example that includes 1T1C memory cells, in a folded DRAM configuration, that are each coupled to a sense amplifier 206. However, embodiments are not so limited, such that some embodiments may have memory cells in a 2T2C DRAM configuration.

In the embodiment illustrated in FIG. 2, the memory array 230 is an array (e.g., a DRAM array) of memory cells that may each include an access device 202 (e.g., a transistor) and a storage element 203 (e.g., a capacitor). The memory cells of the memory array 230 may be arranged in rows (as shown at 119 in FIG. 1B, at 319 in FIG. 3, and at 419-1 and 419-2 in FIGS. 4A and 4B) coupled by access lines 204-X (Row X), 204-Y (Row Y), etc., and columns coupled by pairs of complementary sense lines DIGIT(n–1)/DIGIT(n–1)_, DIGIT(n)/DIGIT(n)_, and DIGIT(n+1)/DIGIT(n+1)_, etc. The individual sense lines corresponding to each pair of complementary data lines may be referred to as sense lines 205-1 (DIGIT(n)) and 205-2 (DIGIT(n)_) respectively. Although only three pairs of complementary sense lines are shown in FIG. 2, embodiments of the present disclosure are not so limited, and an array of memory cells may include additional columns of memory cells and/or sense lines (e.g., 4,096, 8,192, 16,384, etc.). As shown in FIG. 2, a gate of a particular memory cell transistor 202 may be coupled to its corresponding access line 204-X, 204-Y, etc., a first source/drain region may be coupled to its corresponding sense line (e.g., 205-1 (DIGIT(n), 205-2 (DIGIT(n)_), and a second source/drain region of a particular memory cell transistor may be coupled to its corresponding capacitor 203.

Memory cells may be coupled to different sense lines and/or access lines. For example, a first source/drain region of a transistor 202-1 may be coupled to sense line 205-1, a second source/drain region of transistor 202-1 may be coupled to capacitor 203-1, and a gate of a transistor 202-1 may be coupled to access line 204-Y. A first source/drain region of transistor 202-2 may be coupled to sense line 205-2, a second source/drain region of transistor 202-2 may be coupled to capacitor 203-2, and a gate of a transistor 202-2 may be coupled to access line 204-X. The cell plate, as shown in FIG. 2, may be coupled to each of capacitors 203-1 and 203-2. The cell plate may be a common node to which a reference voltage (e.g., ground) may be applied in various memory array configurations.

As described herein, the transistors 202 and capacitors 203 may contribute to formation of the pairs of complementary memory cells in a single row of the memory array 230 that are coupled to the complementary sense lines (e.g., sense lines 205-1 and 205-2). The number of data values (e.g., voltages) sensed from the memory cells (e.g., in read operations) may correspond to the number of columns of memory cells and/or pairs of sense lines (e.g., 4,096, 8,192, 16,384, etc.) that intersect a row, for example, of a subarray 125 shown in and described in connection with FIG. 1B.

The memory array 230 illustrated in FIG. 2 is coupled to read/latch circuitry (e.g., as shown at 150 and described in connection with read/latch stripes 124 in FIGS. 1A and 1B). In a number of embodiments, the read/latch circuitry may include the sense amplifier 206 corresponding to respective columns of memory cells (e.g., coupled to respective pairs of complementary data lines 205-1, 205-2). The sense amplifier 206 may be operated to determine a data value (e.g., logic state) stored in a selected memory cell. The sense amplifier 206 may include a cross coupled latch (not shown). The sense amplifier 206 may be coupled to equilibration circuitry (not shown), which may be configured to equilibrate the sense lines 205-1 and 205-2.

Figure 3:
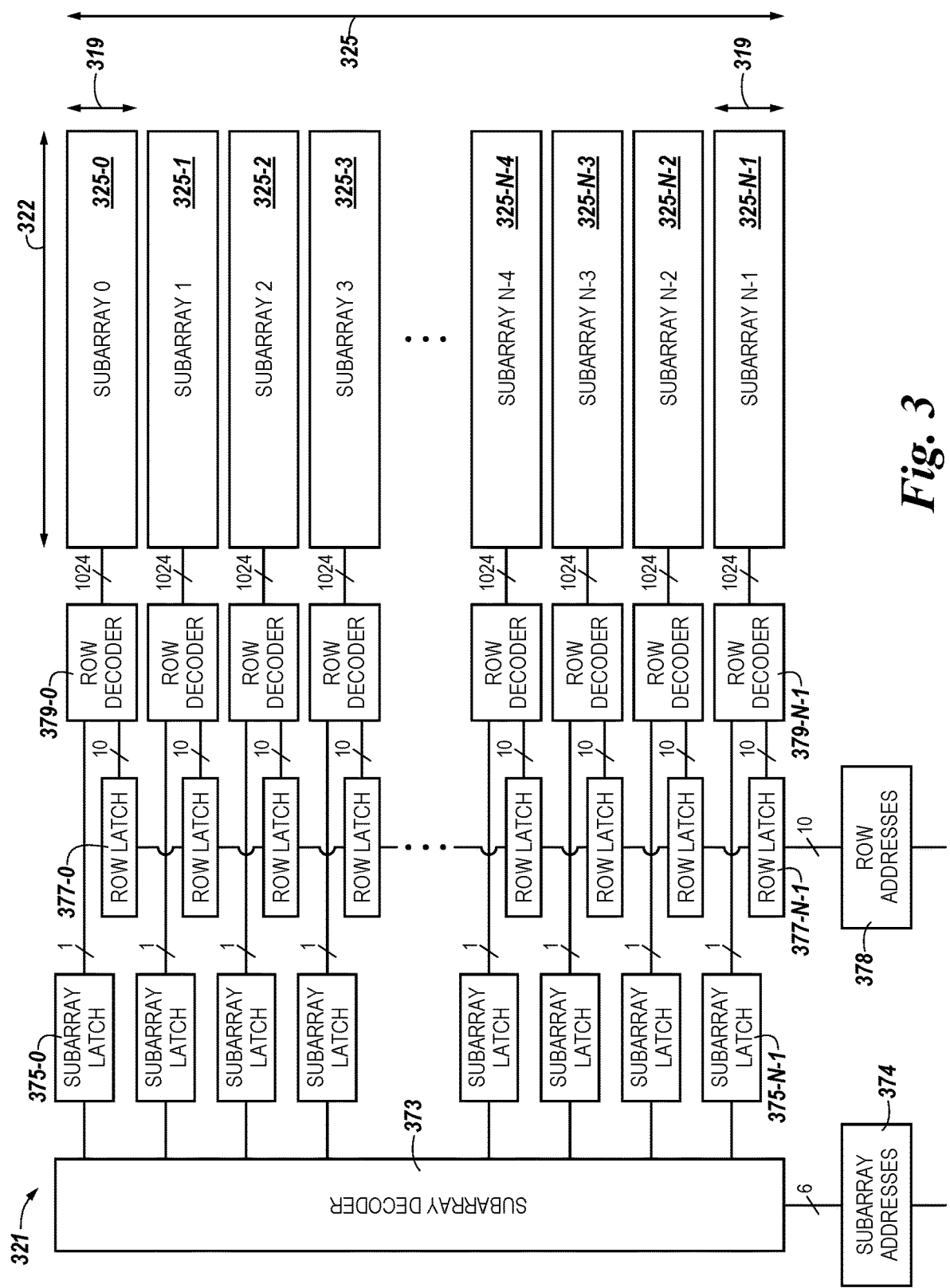
FIG. 3 is a schematic diagram illustrating circuitry for subarray addressing in accordance with a number of embodiments of the present disclosure.

FIG. 3 is a schematic diagram illustrating circuitry for subarray addressing in accordance with a number of embodiments of the present disclosure. As described herein, an apparatus (e.g., computing system 100 shown in FIG. 1A) may include a plurality of subarrays (e.g., as shown at 325-0, 325-1, . . . , 325-N–1) within a bank 321 of a memory device 120. The apparatus may further include circuitry, as shown in FIG. 3, within the bank 321 that may be coupled to the plurality of subarrays and configured to activate a row at a particular ordinal position (e.g., selected from rows 319) in a first subarray (e.g., 325-0) of the plurality of subarrays during a time period and to activate a row at a different ordinal position (e.g., selected from rows 319) in a second subarray (e.g., 325-N–1) of the plurality of subarrays during the same time period.

The rows may each include a plurality of memory cells (e.g., as shown and described in connection with FIG. 2) corresponding to (e.g., coupled to) respective columns 322. Each subarray of the plurality may, in a number of embodiments, include a same quantity of rows. For example, the rows 319 in respective subarrays 325-0, 325-1, . . . , 325-N–1 may each be 1024 rows. The first subarray and the second subarray among the plurality of subarrays may be physically separated by read/latch circuitry (e.g., as shown at 150 in FIGS. 1A, at 124 in FIG. 1B, and at 450 in FIGS. 4A and 4B). The read/latch circuitry may include a plurality of sense amplifiers and associated circuitry (e.g., as shown at 206 in FIG. 2 and at 406 in FIGS. 4A and 4B) coupled to the respective plurality of columns 322.

The bank 321 may, in a number of embodiments, include a controller (e.g., as shown at 140 in FIGS. 1A and 1B) configured to provide signals to write and read data to and from the plurality of subarrays. The controller 140 also may send signals and/or instructions (e.g., based upon commands received from host 110) for performance of the subarray and row addressing described herein. The controller 140 may be coupled to the circuitry shown in FIG. 3. For example, the controller 140 may be coupled to a subarray decoder (e.g., as shown at 173 in FIG. 1A and at 373 in FIG. 3). The subarray decoder 373 may, in various embodiments, be coupled to the controller 140 and/or to the memory array 230 of the bank 321 that includes the subarrays 325-0, 325-1, . . . , 325-N−1.

The subarray decoder 373 may output signals that may be latched independently per subarray 325-0, 325-1, . . . , 325-N−1 in subarray latch circuitry (e.g., 375-0, 375-1, . . . , 375-N−1). The latched signals may indicate an activation state of the corresponding subarray. For example, a signal value of 1 latched to subarray latch 375-0 may indicate that subarray 325-0 is activated responsive to receipt of the signal value of 1, whereas a signal value of 0 latched to subarray latch 375-N−1 may indicate that subarray 325-N−1 is not activated.

The circuitry illustrated in FIG. 3 also may include row decode circuitry. The address circuitry may, in a number of embodiments, include row latch circuitry (e.g., 377-0, 377-1, . . . , 377-N−1) per subarray to independently latch row address signals (e.g., received from row address latch circuitry 378 as directed by the controller 140 and/or the host 110) on a per subarray basis. The circuitry may further include a row decoder (e.g., 379-0, 379-1, . . . , 379-N−1) per subarray. Each row decoder 379 may be configured to receive an output of the subarray latch circuitry 375 corresponding to the subarray to indicate the activation state of each subarray, and an output of the row latch circuitry 377 corresponding to the subarray to indicate the activation state of each row of the plurality of subarrays (e.g., based upon a signal value of either 1 or 0 being latched with regard to each row 319 in each of the corresponding subarrays 325-0, 325-1, . . . , 325-N−1).

Accordingly, the circuitry may, for example, include first subarray latch circuitry 375-0 and first row latch circuitry 377-0 selectably coupled to the first subarray 325-0 and second subarray latch circuitry 375-N−1 and second row latch circuitry 377-N−1 selectably coupled to the second subarray 325-N−1. The first latch circuitries 375-0, 377-0 and the second latch circuitries 375-N−1, 377-N−1 may be configured to enable independent subarray and row activation and/or access during the same time period. The circuitry also may, for example, include a first row decoder 379-0 coupled to the first subarray 325-0, a second row decoder 379-N−1 coupled to the second subarray 379-N−1, and the subarray decoder 373 coupled to the first row decoder 379-0 via a first latch (e.g., subarray latch circuitry 375-0) and coupled to the second row decoder 379-N−1 via a second latch (e.g., subarray latch circuitry 375-N−1). The circuitry also may, for example, include row address circuitry (e.g., including the row address latch circuitry 378) coupled to the first row decoder 379-0 via a third latch (e.g., row latch circuitry 377-0) and coupled to the second row decoder 379-N−1 via a fourth latch (e.g., row latch circuitry 377-N−1).

The circuitry illustrated and just described in connection with FIG. 3 is different and physically separate from the read/latch circuitry shown at 150 in FIG. 1A and at 450 in FIGS. 4A and 4B. For example, first read/latch circuitry may be coupled to the first subarray 325-0 and second (e.g., different) read/latch circuitry may be coupled to the second subarray 325-N−1. However, the first read/latch circuitry and the second read/latch circuitry may be physically separated from the circuitry illustrated and described in connection with FIG. 3 that is configured to enable the row activation during the time period.

The first subarray 325-0 and the second subarray 325-N−1 may be addressed with different subarray addresses (e.g., sent from the host 140 to the subarray decoder 373). For example, the host 140 may be configured to provide a row address (e.g., included in or accompanying the subarray address of the address signal) that corresponds to the row at the particular ordinal position in the first subarray 325-0 and to provide a row address that corresponds to the row at the different ordinal position in the second subarray 325-N−1. Based upon the different subarray addresses, the row at the particular ordinal position and the row at the different ordinal position may be configured to be activated during the time period (e.g., via signal values being latched at a subarray latch 375 and a row latch 377 and implemented by a row decoder 379). Based upon the different subarray addresses directing activation of the row at the particular ordinal position and the row at the different ordinal position, first read/latch circuitry coupled to the first subarray 325-0 may be configured to sense (e.g., access) the activated row at the particular ordinal position and second read/latch circuitry coupled to the second subarray 325-N−1 may be configured to sense the activated row at the different ordinal position.

The circuitry illustrated in FIG. 3 may include subarray address latch circuitry 374, which may latch received subarray addresses (e.g. address signals sent from the host 110 and/or the controller 140). The latched subarray addresses may be decoded via subarray decoder 373. In the example shown in FIG. 3, the subarray addresses are 6 bit addresses used to select one of 64 (e.g., $2^6$) subarrays (e.g., 325-0 through 325-63). The subarray address latch circuitry 374 may thus store (e.g., latch) the different subarray addresses of the first subarray and the second subarray. In a number of embodiments, as described herein, more than two subarray addresses may be latched by the subarray address latch circuitry 374 for activation of more than two subarrays (e.g., in addition to activation of the different rows in each activated subarray) during the same time period.

The output of the subarray decoder 373 may be provided to the subarray latches 375-0 to 375-N−1, which are configured to latch an indication of whether or not the respective subarray is to be activated (or not) during a particular address access cycle. For instance, in this example, the subarray latches 375-0 to 375-N−1 may each include a single latch whose value (e.g., "1" or "0") indicates whether the corresponding subarray is to be activated. The outputs of the subarray latches 375 may be provided to corresponding respective row decoders 379-0 to 379-N−1.

The row address latch circuitry 378 is configured to latch received row addresses (e.g. row address signals provided from the host 110 and/or the controller 140). The latched row addresses may be stored (e.g., latched) in respective latches of row latch circuitries 377-0 to 377-N−1 and may be decoded via the row decoders 379-0 to 379-N−1. In the example shown in FIG. 3, the row addresses are 10 bit addresses used to select one of 1024 (e.g., $2^{10}$) rows (e.g., each subarray comprises 1024 rows 319). The row address latch circuitry 378 may thus store (e.g., latch) the different row addresses of subarrays to be accessed.

As an example, a first row latch circuitry 377-0, coupled to a first subarray 325-0 (e.g., via first row decoder 379-0), may latch a first row address provided by row address latch circuitry 378 for activation of the row at the corresponding particular ordinal position within the first subarray. A second row latch circuitry 377-N−1, coupled to a second subarray 325-N−1 (e.g., via second row decoder 379-N−1), may latch a second (e.g., different) row address provided by the row address latch circuitry 378 for activation of the row at the corresponding different ordinal position within the second subarray. The row latch circuitries 377-0 to 377-N−1 provide the ability to independently latch different row addresses on a per subarray basis, as compared to some prior approaches in which a same row address is provided to all row decoders corresponding to a particular bank (e.g., such that rows at different ordinal positions in different subarrays cannot be concurrently activated during a particular subarray access cycle).

The row decoders 379-0 to 379-N−1 are configured to decode latched row addresses provided by respective row latch circuitries 377-0 to 377-N−1 (e.g., to select one of 1024 rows 319 for activation). In an example, a first row decoder 379-0 may be coupled to the first subarray 325-0 and may be configured to decode a first subarray selection signal sent from a corresponding subarray latch circuitry 375-0 and to decode a first row address sent from the corresponding row latch circuitry 377-0 for selection of the row at the particular ordinal position of the first subarray 325-0. A second row decoder 379-N−1 may be coupled to the second subarray 325-N−1 and may be configured to decode a second subarray selection signal sent from the corresponding subarray latch circuitry 375-N−1 and to decode a second address sent from the corresponding row latch circuitry 377-N−1 for selection of the row at the different ordinal position of the second subarray 325-N−1.

Responsive to the first row decoder 379-0 decoding the first signals for selection of the first subarray and the row at the particular ordinal position of the first subarray and the second row decoder 379-N−1 decoding the second signals for selection of the second subarray and the row at the different ordinal position of the second subarray, the first and second subarrays, along with the different row in each subarray, may be activated during the same time period. Activation of the appropriate row in each subarray may be enabled by, for example, 1024 signal lines coupled to the respective 1024 rows in each subarray, as indicated by the number 1024 associated with the line connecting each of the row decoders 370-0, . . . , 370-N−1 with the respective subarrays 325-0, . . . , 325-N−1. In a number of embodiments, as described herein, more than two rows, and more than two corresponding subarrays, may be activated during the same time period.

In a number of embodiments, the subarray address latch circuitry 374 and/or the row address latch circuitry 378 may be physically associated with (e.g., part of and/or coupled to) the address circuitry (e.g., shown at 142 and described in connection with FIG. 1A) utilized in performance of read/write DRAM operations. The subarray decoder 373 and/or the row decoder 379 may, in a number of embodiments, be circuitry that is configured to perform, respectively, the subarray and row addressing operations described herein in addition, or as an alternative, to circuitry for other implementations in which the subarray addressing may be performed by addressing a row at a particular ordinal position in a first subarray by using a address signal that concurrently addresses a row at a same ordinal position in a second subarray. The subarray latch circuitry (e.g., 375-0, 375-1, . . . , 375-N−1) per subarray and/or the row latch circuitry (e.g., 377-0, 377-1, . . . , 377-N−1) per subarray shown in FIG. 3, however, represent circuitries separate from and/or not utilized in association with the circuitry for the other implementations because the other implementations do not, for example, concurrently and/or individually address differently positioned rows in different subarrays with appropriate address signals.

The controller 140 may be configured to direct receipt of first data values from a row (e.g., selected from rows 319) of the first subarray (e.g., 325-0) to a corresponding number of the sense amplifiers in the read/latch circuitry of the first subarray and to direct receipt of second data values from a row (e.g., selected from rows 319) of the second subarray (e.g., 325-N−1) to a corresponding number of the sense amplifiers in the read/latch circuitry of the second subarray. The controller 140 may be further configured to direct movement of the first and second data values from the corresponding read/latch circuitries to a coupled shared I/O line (e.g., for movement via coupled shared lines 455-1, 455-2, . . . , 455-M shown in FIGS. 4A and 4B) within a 10 ns time period.

The controller 140 may, in number of embodiments, be further configured to direct continuous storage by the corresponding number of the sense amplifiers of the first and second data values received from the corresponding rows of the first and second subarrays. The continuous storage of the first and second data values may enable continued performance of an initiated data movement operation via the coupled shared I/O line from a first cycle to a second cycle. The first and second cycles may correspond to a first and second clock cycle of the computing system 100 and/or first and second cycles through a plurality of cycles of the multiplexers 460-1, 460-2 coupling to the respective sense amplifiers, as described in connection with FIGS. 4A and 4B. As such, the performance of the data movement operation may be continued without a repeat of the receipt of the first and second data values by the sense amplifiers from the corresponding rows of the first and second subarrays.

The controller 140 may be configured to receive (e.g., from host 110) coded instructions for performance of a data movement operation from the selected row of the first subarray and the selected row of the second subarray to enable performance of a memory operation (e.g., a read, write, erase operation, etc.) and/or a compute operation (e.g., a logical operation, such as a Boolean operation, among other logical operations) on the first data value and the second data value (e.g., performed by processor 172). For example, the controller 140 may be configured to receive a request for an operation that includes movement of the data from the source location to the destination location, to initiate performance of the data movement operation, and to receive a request for performance of a DRAM operation (e.g., a DRAM read and/or write operation). The controller 140 may be further configured to sequence input of the first data value to a shared I/O line from the first sense amplifier relative to input of the second data value to the shared I/O line from the second sense amplifier. As such, the sense amplifiers described herein are configured to enable performance of memory operations and/or compute operations in connection with the selectably coupled first row and the selectably coupled second row.

Figure 4A:
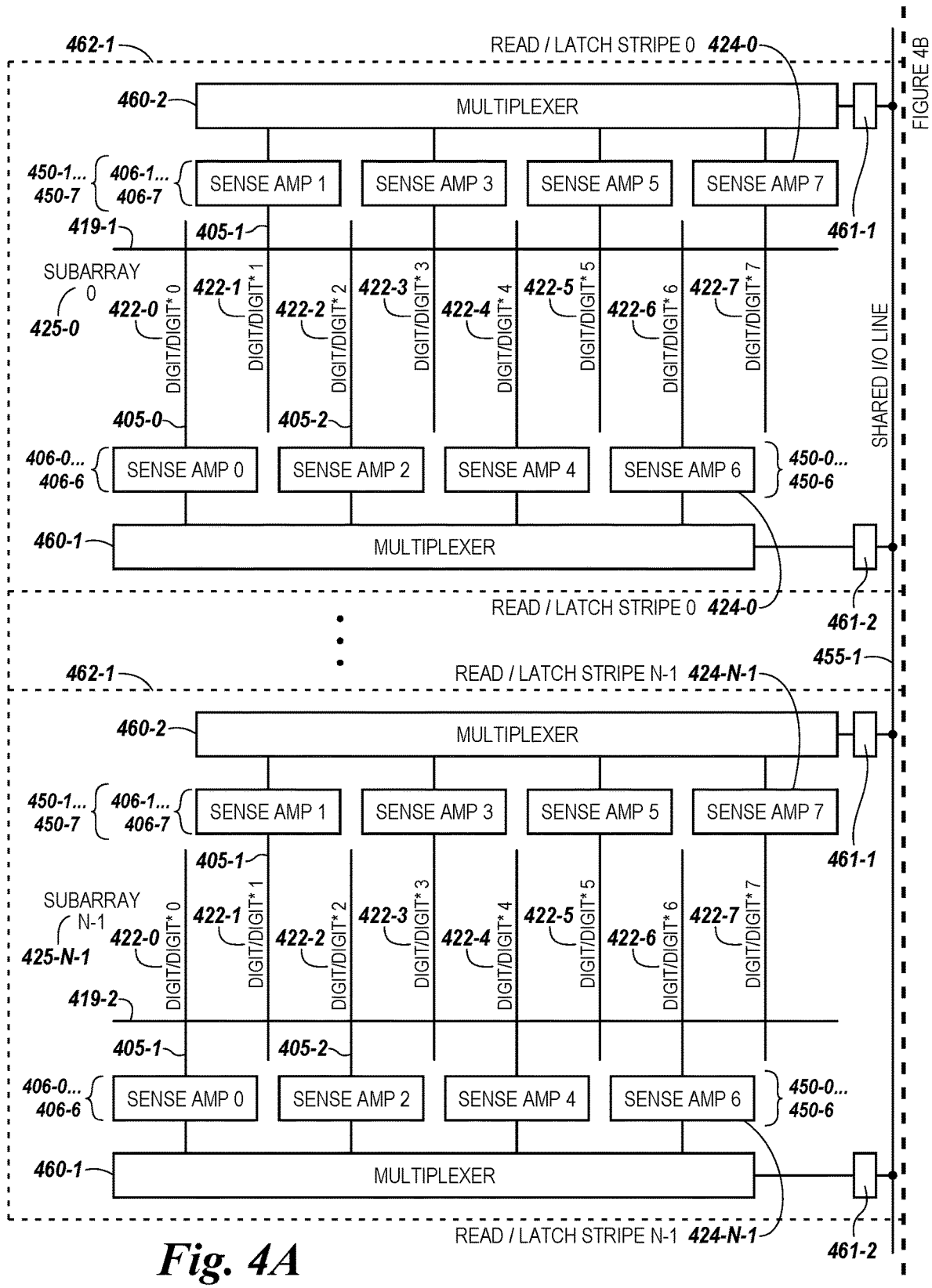
FIGS. 4A and 4B are a schematic diagram illustrating circuitry for data movement in accordance with a number of embodiments of the present disclosure.
Figure 4B:
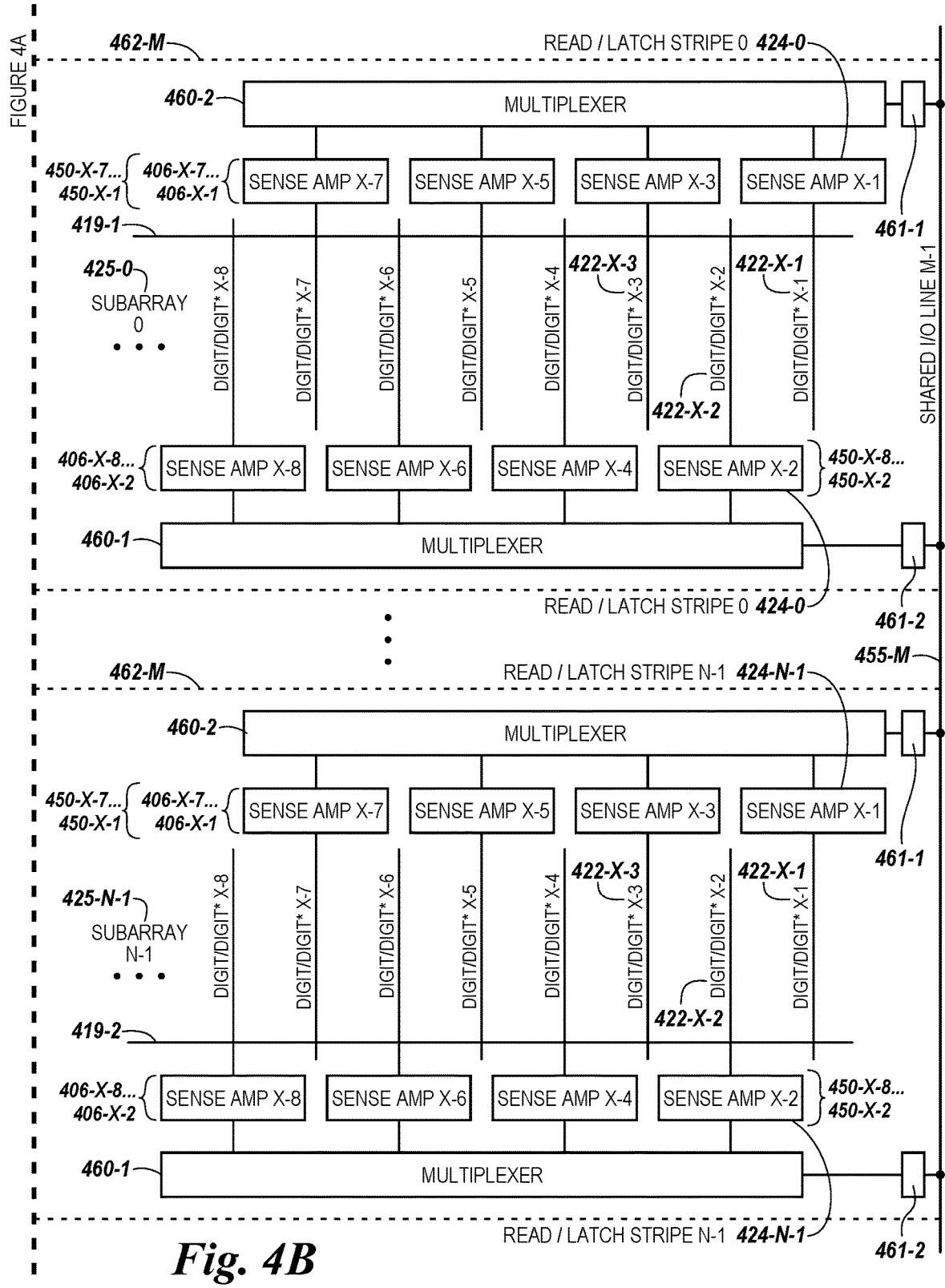

FIGS. 4A and 4B provide a schematic diagram illustrating circuitry for data movement in accordance with a number of embodiments of the present disclosure. As illustrated in FIGS. 1A and 1B and shown in more detail in FIGS. 4A and 4B, a bank 121 or a bank section 123 of a memory device 120 may include a plurality of subarrays, which are indicated by way of example in FIGS. 4A and 4B at 425-0 as subarray 0 and at 425-N−1 as subarray N−1.

FIGS. 4A and 4B, which are to be considered as horizontally connected, illustrate that each subarray (e.g., subarray 425-0 partly shown in FIG. 4A and partly shown in FIG. 4B) may have a number of associated sense amplifiers 406-0, 406-1, . . . , 406-X−1. For example, each subarray 425-0, . . . , 425-N−1 may have one or more associated read/latch stripes (e.g., 124-0, . . . , 124-N in FIG. 1B). In a number of embodiments, each subarray 425-0, . . . , 425-N−1 may be split into portions 462-1 (shown in FIG. 4A), 462-2, . . . , 462-M (shown in FIG. 4B). The portions 462-1, . . . , 462-M may be defined by configuring a predetermined number of the sense amplifiers (e.g., read/latch circuitry 450), along with the corresponding columns (e.g., 422-0, 422-1, . . . , 422-7, among columns 422-0, . . . , 422-X−1) to a given shared I/O line (e.g., 455-1, 455-2, . . . , 455-M).

In some embodiments, as shown in FIGS. 4A and 4B, the predetermined number of the sense amplifiers, along with the corresponding columns, per shared I/O line may be eight, for example. The number of portions 462-1, 462-2, . . . , 462-M of the subarray may be the same as the number of shared I/O lines 455-1, 455-2, . . . , 455-M configured to couple to the subarray. The subarrays may be arranged according to various DRAM architectures for coupling shared I/O lines 455-1, 455-2, . . . , 455-M between subarrays 425-0, 425-1, . . . , 425-N−1.

For example, portion 462-1 of subarray 425-0 in FIG. 4A may have sense amplifier 406-0 coupled to column 422-0. As described herein, a column may include a single digit line 405-0 (sense line) for a single column of memory cells. However, alternative embodiments may include a pair of complementary digit lines referred to as digit line 0 and digit line 0*. Embodiments are not so limited.

As illustrated in FIG. 1B and shown in more detail in FIGS. 4A and 4B, a sensing circuitry stripe (e.g., a read/latch stripe) may, in various embodiments, extend from one end of a subarray to an opposite end of the subarray. For example, as shown for subarray 0 (425-0), read/latch stripe 0 (424-0, shown schematically above and below DRAM columns in a folded sense line architecture) may include and extend from sense amplifier 0 (406-0) in portion 462-1 to sense amplifier X−1 (406-X−1) in portion 462-M of subarray 0 (425-0).

The configuration illustrated in FIGS. 4A and 4B for the sense amplifiers 406-0, 406-1, . . . , 406-X−1 in combination with the shared I/O lines 455-1, 455-2, . . . , 455-M is not limited to half the combination of the sense amplifiers of the read/latch circuitry 450 being formed above the columns of memory cells and half being formed below the columns of memory cells 422-0, 422-1, . . . , 422-X−1 in a folded DRAM architecture. For example, in various embodiments, a read/latch stripe 424 for a particular subarray 425 may be formed with any number of the sense amplifiers of the read/latch stripe being formed above and below the columns of memory cells. Accordingly, in some embodiments as illustrated in FIG. 1B, all of the sense amplifiers of the read/latch circuitry and corresponding read/latch amplifier stripes may be formed above or below the columns of memory cells.

As described in connection with FIGS. 4A and 4B, each subarray may have column select circuitry (not shown) and/or multiplexers (e.g., 460-1, 460-2) that are configured to implement data movement operations on particular columns 422 of a number of subarrays (e.g., subarrays 425-0 and 425-N−1) and the complementary digit lines thereof, involving movement of stored data values accessed from the sense amplifiers 406 to the coupled shared I/O lines 455-1, . . . , 455-M (e.g., complementary shared I/O lines in a number of embodiments). For example, the controller 140 may direct that data values of memory cells in a particular row (e.g., row 419-1) of a subarray (e.g., 425-0) be sensed (e.g., accessed) and moved and that data values of memory cells in a different numbered row (e.g., row 419-2) of a different subarray (e.g., 425-N−1) in a same or different numbered column may be sensed and moved via the shared I/O lines 455-1, . . . , 455-M to a predetermined destination location (e.g., to data I/O pins of I/O circuitry 144 and/or processor 172). In a number of embodiments, data values from different portions of the two subarrays may be sensed and moved (e.g., from portion 462-1 of subarray 425-0 and from portion 462-M of subarray 425-N−1) to the destination location.

The controller may be further configured to direct movement of the data values from a selected first row (e.g., row 419-1) and a selected sense line in the first subarray (e.g., subarray 425-0) and movement of the data values from a selected second row (e.g., row 419-2) and a selected sense line in the second subarray (e.g., subarray 425-N−1) via the shared I/O line (e.g., shared I/O line 455-1) to the data I/O pins and/or the processor for performance of data processing. In various embodiments, the processor 172 may be coupled to (e.g., part of or physically associated with) the host 110 as the destination location. In some embodiments, all the data values from the respective rows (e.g., rows 419-1 and 419-2) may be moved to the processor (e.g., via the data I/O pins) using the plurality of shared I/O lines 455-1, . . . , 455-M selectably coupled to the respective rows.

The multiplexers 460-1, 460-2 may direct (e.g., via the column select circuitry) movement (e.g., sequential movement) of each of, for example, the eight columns (e.g., digit/digit*) in the portion (e.g., 462-1) of the subarray (e.g., 425-0) for a particular row such that the sense amplifiers of the read/latch stripe (e.g., 424-0) for that portion may store (cache) and move all data values to the shared I/O line in a particular order (e.g., in an order in which the columns were sensed). With complementary digit lines (digit/digit*) and complementary shared I/O lines 455, for each of eight columns, there may be 16 data values (e.g., bits) sequenced to the shared I/O line from one portion of the subarray such that one data value (e.g., bit) is input to each of the complementary shared I/O lines at a time from each of the sense amplifiers.

As such, with 2048 portions of subarrays each having eight columns (e.g., subarray portions 462-1, 462-1, . . . , 462-M of each of subarrays 425-0, 425-1, . . . , 425-N−1), and each configured to couple to a different shared I/O line (e.g., 455-1 through 455-M), 2048 data values (e.g., bits) may be moved to the plurality of shared I/O lines at substantially the same point in time (e.g., in parallel). Accordingly, the present disclosure describes configuring the plurality of shared I/O lines to be at least a thousand bits wide (e.g., 2048 bits wide) to increase the speed, rate, and/or efficiency of data movement in a DRAM implementation (e.g., relative to a 64 bit wide data path).

For example, first read/latch circuitry 450 (e.g., including sense amplifiers 406 and associated circuitry) may be configured to enable movement of data values accessed from the first row (e.g., 419-0) of the first subarray (e.g., 425-0) and second read/latch circuitry 450 may be configured to enable movement of data values accessed from the second row (e.g., 419-2) of the second subarray (e.g., 425-N−1) for performance of a read operation on the accessed data values. In some embodiments, the read operation and/or the data movement operation may enable performance of a compute operation (e.g., a mathematical and/or Boolean operation) on the first data value and the second data value at the destination location (e.g., processor 172). In some embodiments, the first read/latch circuitry may be configured to enable movement of data values to the first subarray and the second read/latch circuitry may be configured to enable movement of data values to the second subarray for performance of a write operation on the moved data values.

As illustrated in FIGS. 4A and 4B, in each subarray (e.g., subarray 425-0) one or more multiplexers 460-1, 460-2 may be coupled to the sense amplifiers of each portion 462-1, 462-2, . . . , 462-M of the read/latch stripe 424-0 for the subarray. The multiplexers 460-1, 460-2 may be configured to access, select, receive, coordinate, combine, and transport the data values (e.g., bits) stored (cached) by the number of selected sense amplifiers in a portion (e.g., portion 462-1) of the subarray to be input to the shared I/O line (e.g., shared I/O line 455-1). As such, a shared I/O line, as described herein, may be configured to couple a source location in a bank to a destination location (e.g., data I/O pins) for improved data movement.

The controller may, as described herein, be configured to move the data from selected rows and selected sense lines in the source locations to a selected destination location (e.g., data I/O pins) via the shared I/O line (e.g., in response to signals from the controller 140 and/or host 110). The controller of the array may be configured to direct, concurrently (e.g., essentially simultaneously) or to within 5 ns of each other, storage by a first sense amplifier of a first data value sensed at a particular ordinal position of a row (e.g., 419-1) of a first subarray (e.g., 425-0) and storage by a second sense amplifier of a second data value sensed at a different ordinal position of a row (e.g., 419-N–1) of a second subarray (e.g., 425-N–1). The controller may be further configured to direct access of a stored first data value from the first sense amplifier to couple to a shared I/O line and access of a stored second data value from the second sense amplifier to couple to the same shared I/O line.

In a number of embodiments, the different subarrays and the different rows in each of the different subarrays may be activated and the data values from the activated rows may be sensed and stored (e.g., accessed) by the respective read/latch circuitries within a first time period, which may be concurrently (e.g., essentially simultaneously) or within a 5 ns time window. The data values may be accessed from the respective read/latch circuitries and moved to the data I/O pins formed as part of the I/O circuitry 144 within a second time period (e.g., 10 ns) after the rows are activated and the data values are sensed and stored. In a number of embodiments, the data movement may be performed via the coupled shared I/O lines described herein and/or via I/O lines coupling each of the sense amplifiers in the respective read/latch stripes to the data I/O pins. Accordingly, the controller described herein may be configured to direct coupling (e.g., via signals to the multiplexers and/or the sense amplifiers in the respective read/latch stripes) to the various embodiments of the I/O lines for movement of stored data values within the second time period.

For example, in a number of embodiments, a first sense amplifier may be configured to couple to a shared I/O line within 10 ns of a second sense amplifier being coupled to the same shared I/O line to enable movement of the stored first data value and the stored second data value via the same shared I/O line to a destination location (e.g., to the data I/O pins and, consequently, to the processor 172 of host 110). A first set of sense amplifiers (e.g., read/latch stripe 424-0 including the first sense amplifier among a plurality of sense amplifiers) may be configured to send data sensed from the row at the particular ordinal position of the first subarray in parallel to a plurality of shared I/O lines (e.g., 455-1, . . . , 455-M). A second set of sense amplifiers (e.g., read/latch stripe 424-N–1 including the second sense amplifier among a plurality of sense amplifiers) may be configured to send data sensed from the row at the different ordinal position of the second subarray in parallel to the plurality of shared I/O lines.

The data (e.g., number of bits) being sent may correspond to at least a thousand bit width of the plurality of shared I/O lines and a subset of the plurality of sense amplifiers that may be selectably and sequentially coupled to the plurality of shared I/O lines. For example, one eighth of 16,384 sense amplifiers selectably and sequentially coupled to 2048 shared I/O lines corresponds to 2048 bits being sent in parallel via the plurality of shared I/O lines from read/latch stripe 424-0 and read/latch stripe 424-N–1. As described herein, a destination location may be, or may include, a processor 172 configured to perform data processing on the first data value and the second data value.

Address signals (e.g., from host 110) may be received by the controller 140 within the bank 121 of the memory device 120 and the controller 140 may direct, in response to the address signals, circuitry coupled to the plurality of subarrays (e.g., subarrays 425-0, 425-1, . . . , 425-N–1) to activate a row (e.g., 419-1) at a particular ordinal position in a first subarray (e.g., 425-0) of the plurality of subarrays during a first time period and a row at a different ordinal position (e.g., 419-2) in a second subarray (425-N–1) of the plurality of subarrays during the first time period. The first time period may, in a number of embodiments, be activation of the rows in a same time period, which may be concurrently (e.g., essentially simultaneously) or both being activated within a 5 ns time window.

A first signal (e.g., corresponding to a particular subarray address determined by subarray decoder shown at 373 and described in connection with FIG. 3) may be stored by a first subarray latch (e.g., subarray latch circuitry 375-0) coupled to the first subarray 425-0. A second signal corresponding to a different subarray address may be stored by a second subarray latch (e.g., subarray latch circuitry 375-N–1) coupled to the second subarray 425-N–1. The row at the particular ordinal position and the row at the different ordinal position may be activated during the first time period responsive to the storage of the first signal and the second signal.

Row address signals, as described herein, may be used for addressing the row in the first subarray and the row in the second subarray with a row address corresponding to the particular ordinal position in the first subarray and a different row address corresponding to the different ordinal position in the second subarray. Addressing the row in the first subarray and the row in the second subarray with the row address signals corresponding to their different ordinal positions may be performed instead of addressing the row at the particular ordinal position in the first subarray by using an address signal that concurrently addresses a row at a same ordinal position in the second subarray, as done in other implementations, in order to increase the speed, rate, and/or efficiency for subarray addressing. For example, inactivation of the row at the particular ordinal position in the first subarray and the second subarray followed by activation of a row at the different ordinal position in the first subarray and the second subarray enabled by a second address signal may extend through a time period ranging from 30 ns to 60 ns, rather than concurrent activation (e.g., up to a 5 ns time period) enabled by using the different row addresses for the first subarray and the second subarray described herein.

The row activation during the first time period may enable reduction in a latency between sensing a first data value stored in the row at the particular ordinal position in the first subarray and sensing a second data value stored in the row at the different ordinal position in the second subarray. The reduction in latency may be relative to switching from activation of the row at the particular ordinal position in the first subarray and the second subarray to activation of the row at the different ordinal position in the first subarray and the second subarray as done in the other implementations.

Coupling of a shared I/O line to read/latch circuitry of the first subarray and to read/latch circuitry of the second subarray in a second time period (e.g., within 10 ns relative to previously activating the rows in the first time period of 0-5 ns) may enable increasing a throughput capability (e.g., a number of bits actually moved per second) of the shared I/O line for data values stored in the row at the particular ordinal position in the first subarray row and the row at the different ordinal position in the second subarray. The increased throughput capability of the shared I/O line of the present disclosure may be determined relative to other implementations that include activating the row at the particular ordinal position in the first subarray and the second subarray and coupling read/latch circuitry for the first subarray and read/latch circuitry for the second subarray to the shared I/O line followed by activating the row at the different ordinal position in the first subarray and the second subarray and recoupling read/latch circuitry for the first subarray and read/latch circuitry for the second subarray to the shared I/O line.

For example, a plurality of rows at different ordinal positions in different subarrays may be activated concurrently (or within a 5 ns time period) based upon the different row addresses and the data values from two different rows may be moved (e.g., coupled to and/or sent) via a particular shared I/O line within a 10 ns time period (e.g., within 4 ns of each other in some embodiments). This may increase the throughput capability of a coupled shared I/O line relative to the other implementations in which just performance of inactivation of the row at the particular ordinal position in the first subarray and the second subarray followed by activation of the row at the different ordinal position in the first sub array and the second subarray may take a time period ranging from 30-60 ns. The time period ranging from 30-60 ns does not even include time taken for sensing the data values, accessing the data values, and/or coupling to an appropriate shared I/O line.

A first data value may be stored in the row at the particular ordinal position in the first subarray and a second data value may be stored in the row at the different ordinal position in the second subarray in the physical bank 121 of the memory device 120. The address signals described herein may include the first subarray being addressed with a particular subarray address and the second subarray being addressed with a different subarray address in order to form a virtual bank relative to other implementations that include activating the row at the particular ordinal position in the first subarray and the second subarray followed by activating the row at the different ordinal position in the first subarray and the second subarray. For example, first read/latch circuitry may be selectably coupled to a first row indicated by the particular row address in order to access data values of the first row and second read/latch circuitry may be selectably coupled to a second row indicated by the different row address in order to access data values of the second row in order to form the virtual bank and to enable performance of a read operation on the accessed data values of the first and second rows. In some embodiments, activating the different rows in the different subarrays of the bank, as described herein, may enable performance of a write operation on memory cells of the first and second rows.

In a number of embodiments, read/latch circuitries (e.g., 450-0, 450-1, . . . , 450-X-1 in FIGS. 4A and 4B) may be selectably and/or individually coupled to each of the plurality of subarrays (e.g., 425-0, 425-1, . . . , 425-N-1) and/or to a shared I/O line (e.g., at least one of 455-1, 455-2, . . . , 455-M). For example, one out of the eight sense amplifiers (e.g., 406-0, 406-1, . . . , 406-7) in the read/latch stripe 424-0 for portion 462-1 in subarray 425-0 and one out of the eight sense amplifiers in the read/latch stripe 424-N-1 for portion 462-1 in subarray 425-N-1 may be selectably coupled to shared I/O line 455-1. In some embodiments, the shared I/O line may be selectably coupled to at least three of the read/latch circuitries that are individually coupled to at least three of the plurality of subarrays. For example, at least three of the read/latch circuitries may be coupled essentially concurrently (e.g., within a 10 ns time period of a preceding read/latch circuitry being coupled) to move the data values via the shared I/O line.

A read/latch stripe (e.g., sense amplifiers 406 in all read/latch stripes 424-0, . . . , 424-N-1) in each of a plurality of subarrays (e.g., subarrays 425-0, . . . , 425-N-1) may be configured to couple to the plurality of shared I/O lines (e.g., 455-1, . . . , 455-M). In some embodiments, only one of a plurality (e.g., two, four, eight, sixteen, etc., including odd numbers) of columns 422 may be coupled at a time in the first subarray to one of the plurality of shared I/O lines using the first read/latch stripe (e.g., read/latch stripe 424-0) and only one of a plurality (e.g., two, four, eight, sixteen, etc., including odd numbers) of columns 422 at a time in the second subarray may be coupled to one of the plurality of shared I/O lines using the second read/latch stripe (e.g., read/latch stripe 424-N-1).

In various embodiments, the controller 140 may select (e.g., open and/or activate) a first row of memory cells for the first read/latch stripe to sense (e.g., access) data stored therein, couple (e.g., open) the plurality of shared I/O lines to the first read/latch stripe, and couple (e.g., open) the second read/latch stripe to the plurality of shared I/O lines (e.g., via the column select circuitry and/or multiplexers 760-1, 760-2). As such, the data values may be moved in parallel from the first read/latch stripe and moved in parallel from the second read/latch stripe to the destination location via the plurality of shared I/O lines. In a number of embodiments, the first read/latch stripe and the second read/latch stripe may store (e.g., cache) the sensed data values.

A shared I/O line may be used (e.g., in a DRAM implementation) as a data path to move data from various locations (e.g., subarrays) in the memory cell array. The shared I/O line may be shared between all read/latch stripes. In various embodiments, the sense amplifiers of one read/latch stripe, two read/latch stripes, or more than two may be coupled to the shared I/O line at any given time. A row coupled to the first read/latch stripe may be opened and the data values of the memory cells in the row may be sensed. After sensing, the first read/latch stripe (e.g., the sense amplifiers thereof) may be opened to the shared I/O line, along with opening the second read/latch stripe (e.g., the sense amplifiers thereof) to the same shared I/O line.

For example, the first read/latch stripe 424-0 may include a number of sense amplifiers 406 configured to store first data values sensed in the first row 419-1 of the first subarray 425-0 and to move the first data values via a coupled shared I/O line 455-1 and the second read/latch stripe 424-N-1 may include a number of sense amplifiers configured to store second data values sensed in the second row 419-2 of the second subarray 425-N-1 and move the second data values via the coupled shared I/O line 455-1. The number of sense amplifiers in the first read/latch stripe may be configured to couple to the shared I/O line within 10 ns of the number of sense amplifiers in the second read/latch stripe being coupled to the shared I/O line to enable movement of the first data values and the second data values to the destination location.

Alternatively or in addition, a first buffer (e.g., as shown at 461-1 and 461-2 in subarray portion 462-1 of subarray 425-0) may be coupled to a first sense amplifier (e.g., coupled to at least one of sense amplifiers 406-0, . . . , 406-7 in subarray portion 462-1 of subarray 425-0 via multiplexers 460-1, 460-2). The first buffer 461-1, 461-2 may be further coupled to a shared I/O line (e.g., shared I/O line 455-1). The first buffer 461-1, 461-2 may be configured to store a first data value, accessed from the first sense amplifier, for movement via the shared I/O line 455-1. A second buffer (e.g., as shown at 461-1 and 461-2 in subarray portion 462-1 of subarray 425-N-1) may be coupled to a second sense amplifier (e.g., coupled to at least one of sense amplifiers 406-0, . . . , 406-7 in subarray portion 462-1 of subarray 425-N-1 via multiplexers 460-1, 460-2) and may be further coupled to the same shared I/O line (e.g., shared I/O line 455-1). The second buffer 461-1, 461-2 may be configured to store a second data value, accessed from the second sense amplifier, for movement via the shared I/O line 455-1. The first data value stored by the first buffer may enable continuous coupling of the first buffer to the shared I/O line and the second data value stored by the second buffer also may enable continuous coupling of the second buffer to the shared I/O line.

For example, the first and second data values may be continuously stored (e.g., through a plurality of cycles of the multiplexers 460-1, 460-2 coupling to the respective sense amplifiers) and the first and second buffers also may be coupled to the shared I/O line to enable the data values to be selectably moved via the shared I/O line at an appropriate time (e.g., determined by the controller 140 and/or the host 110). In various embodiments, the first and second buffers (e.g., in subarray portions 462-1, . . . , 462-M of subarrays 425-0, . . . , 425-N-1) each may be configured to store a plurality of data values (e.g., the data values accessed from sense amplifiers 406-0, . . . , 406-7) to be selectably moved via the shared I/O line at the appropriate time.

Figure 5:
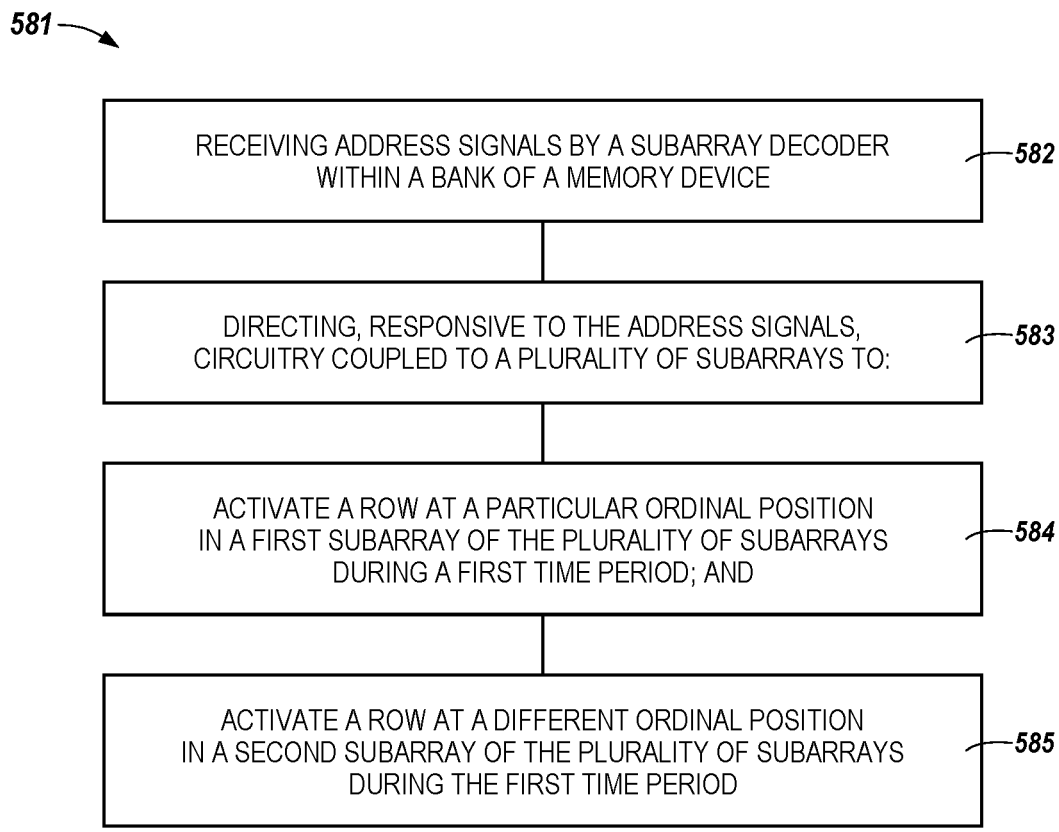
FIG. 5 is a flow chart for subarray addressing in accordance with a number of embodiments of the present disclosure.

FIG. 5 is a flow chart of an embodiment of a method 581 for subarray addressing in accordance with the present disclosure. Unless explicitly stated, elements of methods described herein are not constrained to a particular order or sequence. Additionally, a number of the method embodiments, or elements thereof, described herein may be performed at the same, or at substantially the same, point in time.

At block 582, the method 581 may include receiving address signals by a subarray decoder within a bank of a memory device. The operations of block 582 may, in a number of embodiments, be performed by the subarray address latch circuitry 374 (e.g., as described in connection with FIG. 3), which may latch received subarray addresses (e.g., address signals sent from the host 110 and/or the controller 140 described in connection with FIG. 1A). The latched subarray addresses may be decoded via a subarray decoder 173 or 373 (e.g., as described in connection with FIGS. 1 and 3).

At block 583, the method 581 may include, responsive to the address signals, directing circuitry coupled to a plurality of subarrays to activate a number of rows. The circuitry directed to activate the rows may include a row decoder 179 or 379 (e.g., as described in connection with FIGS. 1 and 3) coupled to a particular subarray 125, 325, or 425 (e.g., as described in connection with FIGS. 1B, 3, and 4). The row decoder 379 may be configured to activate the row at the particular ordinal position, for example, responsive to receiving a first address signal from the subarray decoder 373 and receiving a second address signal sent from row address latch circuitry 378 (e.g., as described in connection with FIG. 3). The first address signal may be sent from, for example, the subarray decoder 373 to the row decoder 379 (e.g., via subarray latch circuitry 375 described in connection with FIG. 3). The second address signal may be sent from, for example, the row address latch circuitry 378 to the row decoder 379 (e.g., via row latch circuitry 377 described in connection with FIG. 3). For example, row decoder 379-0 may be coupled to a first subarray 325-0 and the method may include receiving a first address signal, corresponding to the first subarray 325-0, sent from the subarray decoder 373 and receiving a second address signal, corresponding to a particular row in the first subarray 325-0, sent from the row address latch circuitry 378.

As shown at block 584, the circuitry may be directed to activate a row at a particular ordinal position in a first subarray of the plurality of subarrays during a first time period (e.g., as described in connection with FIGS. 1, 3, and 4). For example, the circuitry (e.g., row decoder 379-0) may be directed to activate row 419-1 in subarray 425-0 (e.g., as described in connection with FIGS. 4A and 4B). In addition, as shown at block 585, the circuitry (e.g., row decoder 379-N-1) may be directed to activate a row at a different ordinal position in a second subarray of the plurality of subarrays during the first time period. For example, the circuitry (e.g., row decoder 379-N-1) may be directed to activate row 419-2 in subarray 425-N-1 during the first time period.

Ordinal positioning, as used herein, is used to distinguish between relative positions of elements within respective groups of elements. For example, a plurality of subarrays may each include a sequence of 1024 rows (e.g., row 0 through row 1023). In this example, row 0 from a particular subarray (e.g., a first row of the particular subarray) has a different ordinal position than any of rows 1 through row 1023 (e.g., a last row) of the other subarrays. However, use herein of ordinal numbers such as "first" and "second" is not intended to indicate a particular ordinal position of an element, unless the context clearly dictates otherwise. For example, consider a row having an ordinal position of row 0 within a particular subarray and a different row having an ordinal position of row 4 in a different subarray. In this example, row 0 might be referred to as a "first" row and row 4 might be referred to as a "second" row, despite not having an ordinal position of row 2. Alternatively, row 4 might be referred to as a "first" row and row 0 might be referred to as a "second" row.

In the above detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and structural changes may be made without departing from the scope of the present disclosure.

As used herein, designators such as "X", "Y", "N", "M", etc., particularly with respect to reference numerals in the drawings, indicate that a number of the particular feature so designated may be included. It is also to be understood that the terminology used herein is for the purpose of describing particular embodiments only, and is not intended to be limiting. As used herein, the singular forms "a", "an", and "the" include singular and plural referents, unless the context clearly dictates otherwise, as do "a number of", "at least one", and "one or more" (e.g., a number of memory arrays may refer to one or more memory arrays), whereas a "plurality of" is intended to refer to more than one of such things. Furthermore, the words "can" and "may" are used throughout this application in a permissive sense (i.e., having the potential to, being able to), not in a mandatory sense (i.e., must). The term "include," and derivations thereof, means "including, but not limited to". The terms "coupled" and "coupling" mean to be directly or indirectly connected physically for access to and/or for movement (transmission) of instructions (e.g., control signals, address signals, etc.) and data, as appropriate to the context. The terms "data" and "data values" are used interchangeably herein and may have the same meaning, as appropriate to the context (e.g., one or more data units or "bits").

As described herein, an "I/O line" may be a line (e.g., bus) selectably shared by (e.g., coupled to) a plurality of subarrays, rows, and/or particular columns of memory cells, for example, via a set of sense amplifiers of read/latch circuitry (e.g., in a read/latch stripe) coupled to each of the subarrays. For example, the sense amplifier of each of a selectable subset of a number of columns (e.g., eight column subsets of a total number of columns) may be selectably coupled to each of a plurality of I/O lines (e.g., shared I/O lines, as described herein) for data values stored (e.g., cached) in the sense amplifiers of the read/latch stripe to be moved to each of the plurality of I/O lines. Because the singular forms "a", "an", and "the" may include both singular and plural referents herein, "a shared I/O line," for example, may be used to refer to "a plurality of shared I/O lines", unless the context clearly dictates otherwise. Moreover, "shared I/O lines" is an abbreviation of "plurality of shared I/O lines".

While example embodiments including various combinations and configurations of read/latch circuitry, sense amplifiers, read/latch stripes, I/O lines, shared I/O lines, subarray decoders, row decoders, and/or multiplexers, among other circuitry for subarray addressing shown and described herein, have been illustrated and described herein, embodiments of the present disclosure are not limited to those combinations explicitly recited herein. Other combinations and configurations of the read/latch circuitry, sense amplifiers, read/latch stripes, I/O lines, shared I/O lines, subarray decoders, row decoders, and/or multiplexers, among other circuitry for subarray addressing, disclosed herein are expressly included within the scope of this disclosure.

Although specific embodiments have been illustrated and described herein, those of ordinary skill in the art will appreciate that an arrangement calculated to achieve the same results may be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and processes are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An apparatus, comprising:
   a plurality of subarrays within a bank of a memory device; and
   circuitry coupled to the plurality of subarrays comprising:
     a subarray decoder whose output is latched independently per subarray in subarray latch circuitry, the latched outputs indicating an activation state of the corresponding subarray; and
   row decode circuitry comprising:
     row latch circuitry, per subarray, to independently latch received row addresses on a per subarray basis;
     a row decoder, per subarray, each configured to receive:
       an output of the subarray latch circuitry corresponding to the subarray; and
       an output of the row latch circuitry corresponding to the subarray;
     a first subarray latch circuitry and a first row latch circuitry selectably coupled to a first subarray;
     a second subarray latch circuitry and a second row latch circuitry selectably coupled to a second subarray; and
     wherein the first latch circuitries and the second latch circuitries are configured to enable independent subarray access and the row activation during the time period; and
   wherein the circuitry coupled to the subarrays is configured to activate:
     a row at a particular ordinal position in a first subarray of the plurality of subarrays during a time period; and
     a row at a different ordinal position in a second subarray of the plurality of subarrays during the time period.

2. The apparatus of claim 1, wherein, based upon different subarray addresses, the row at the particular ordinal position and the row at the different ordinal position are configured to be activated during the time period.

3. The apparatus of claim 1, wherein, based upon different subarray addresses directing activation of the row at the particular ordinal position and the row at the different ordinal position, sensing circuitry coupled to the first subarray is configured to sense the activated row at the particular ordinal position and sensing circuitry coupled to the second subarray is configured to sense the activated row at the different ordinal position.

4. The apparatus of claim 1, wherein:
   the first and second subarrays and the respective row at the particular ordinal position and the row at the different ordinal position are activated;
   data values in the activated rows are accessed by respective sensing circuitries within a first time period of up to 5 nanoseconds; and the data values are accessed from the respective sensing circuitries and moved to input/output (I/O) circuitry within a second time period of up to 10 nanoseconds after the rows are activated and the data values are accessed.

5. The apparatus of claim 1, wherein a controller is configured to provide a row address that corresponds to the row at the particular ordinal position in the first subarray and to a row address that corresponds to the row at the different ordinal position in the second subarray.

6. An apparatus, comprising:
a plurality of subarrays within a bank of a memory device; and
circuitry coupled to the plurality of subarrays comprising:
   a subarray decoder whose output is latched independently per subarray in subarray latch circuitry, the latched outputs indicating an activation state of the corresponding subarray; and
   row decode circuitry comprising:
      row latch circuitry, per subarray, to independently latch received row addresses on a per subarray basis;
      a row decoder, per subarray, each configured to receive:
         an output of the subarray latch circuitry corresponding to the subarray; and
         an output of the row latch circuitry corresponding to the subarray;
      a first row decoder coupled to the first subarray;
      a second row decoder coupled to the second subarray; and
      a subarray decoder coupled to the first row decoder via a first latch and coupled to the second row decoder via a second latch; and
   wherein the circuitry coupled to the subarrays is configured to activate:
      a row at a particular ordinal position in a first subarray of the plurality of subarrays during a time period; and
      a row at a different ordinal position in a second subarray of the plurality of subarrays during the time period.

7. The apparatus of claim 6, further comprising:
row address circuitry coupled to:
   the first row decoder via a third latch; and
   the second row decoder via a fourth latch.

8. An apparatus, comprising:
a plurality of subarrays within a bank of a memory device; and
circuitry coupled to the plurality of subarrays comprising:
   a subarray decoder whose output is latched independently per subarray in subarray latch circuitry, the latched outputs indicating an activation state of the corresponding subarray; and
   row decode circuitry comprising:
      row latch circuitry, per subarray, to independently latch received row addresses on a per subarray basis;
      a row decoder, per subarray, each configured to receive:
         an output of the subarray latch circuitry corresponding to the subarray; and
         an output of the row latch circuitry corresponding to the subarray;
            first sensing circuitry coupled to a first subarray and second sensing circuitry coupled to a second subarray, the first sensing circuitry and the second sensing circuitry each including a sense amplifier coupled to a respective sense line, wherein the first sensing circuitry and the second sensing circuitry are physically separated from the circuitry configured to enable the row activation during the time period; and
   wherein the circuitry coupled to the subarrays is configured to activate:
      a row at a particular ordinal position in a first subarray of the plurality of subarrays during a time period; and
      a row at a different ordinal position in a second subarray of the plurality of subarrays during the time period.

* * * * *